(12) United States Patent
Adachi et al.

(10) Patent No.: US 10,134,662 B2
(45) Date of Patent: Nov. 20, 2018

(54) MOUNTING SUBSTRATE AND METHOD OF MANUFACTURING THE SAME

(71) Applicant: Sony Corporation, Tokyo (JP)

(72) Inventors: Kiwamu Adachi, Kanagawa (JP); Katsuji Matsumoto, Kanagawa (JP); Takeshi Kodama, Kanagawa (JP); Shuichi Oka, Kanagawa (JP); Hiizu Ootorii, Kanagawa (JP); Kazunari Saitou, Kanagawa (JP); Kei Satou, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/510,430

(22) PCT Filed: Sep. 8, 2015

(86) PCT No.: PCT/JP2015/075463
§ 371 (c)(1),
(2) Date: Mar. 10, 2017

(87) PCT Pub. No.: WO2016/043092
PCT Pub. Date: Mar. 24, 2016

(65) Prior Publication Data
US 2017/0287823 A1 Oct. 5, 2017

(30) Foreign Application Priority Data
Sep. 19, 2014 (JP) .................. 2014-190952

(51) Int. Cl.
*H01L 21/44* (2006.01)
*H01L 23/498* (2006.01)
(Continued)

(52) U.S. Cl.
CPC .... *H01L 23/49811* (2013.01); *H01L 21/4853* (2013.01); *H01L 23/12* (2013.01);
(Continued)

(58) Field of Classification Search
CPC ............... H01L 23/49811; H01L 23/12; H01L 21/4853; H01L 24/11; H01L 24/17;
(Continued)

(56) References Cited

U.S. PATENT DOCUMENTS 8,378,505 B2* 2/2013 Nakano ............... H01L 23/3171
257/737
2005/0070083 A1* 3/2005 Johnson .................. H01L 24/13
438/612
(Continued)

FOREIGN PATENT DOCUMENTS

JP 2001-291740 A 10/2001
JP 2006-196693 A 7/2006
(Continued)

OTHER PUBLICATIONS

Written Opinion and English translation thereof dated Dec. 1, 2015 in connection with International Application No. PCT/JP2015/075463.
(Continued)

*Primary Examiner* — Thinh T Nguyen
(74) *Attorney, Agent, or Firm* — Wolf, Greenfield & Sacks, P.C.

(57) ABSTRACT

A method of manufacturing a mounting substrate according to an embodiment of the present technology includes the following three steps:
(1) a step of forming a plurality of electrodes on a semiconductor layer, and thereafter forming one of solder bumps at a position facing each of the electrodes;
(2) a step of covering the solder bumps with a coating layer, and thereafter selectively etching the semiconductor layer with use of the coating layer as a mask to separate the semiconductor layer into a plurality of elements; and
(Continued)

(3) a step of removing the coating layer, and thereafter mounting the elements on a wiring substrate to direct the solder bumps toward the wiring substrate, thereby forming the mounting substrate.

5 Claims, 40 Drawing Sheets

(51) Int. Cl.
  *H01L 23/12* (2006.01)
  *H01L 21/48* (2006.01)
  *H01L 23/00* (2006.01)
(52) U.S. Cl.
  CPC .............. *H01L 24/11* (2013.01); *H01L 24/17* (2013.01); *H01L 2224/11825* (2013.01); *H01L 2224/18* (2013.01); *H01L 2224/32225* (2013.01); *H01L 2224/73204* (2013.01); *H01L 2224/73259* (2013.01); *H01L 2224/73267* (2013.01); *H01L 2224/92244* (2013.01)
(58) Field of Classification Search
  CPC ....... H01L 2224/11825; H01L 23/3171; H01L 2924/014; H01L 2924/01023

USPC ........ 438/612, 666, 613, 108; 257/731, 779, 257/781
  See application file for complete search history.

(56) References Cited

U.S. PATENT DOCUMENTS

| | | | |
|---|---|---|---|
| 2007/0290343 A1 | 12/2007 | Harada et al. | |
| 2011/0278720 A1* | 11/2011 | Nakano | H01L 23/3171 257/737 |
| 2012/0012997 A1* | 1/2012 | Shen | H01L 23/49816 257/737 |
| 2013/0056862 A1* | 3/2013 | Kim | H01L 25/0657 257/692 |

FOREIGN PATENT DOCUMENTS

| | | |
|---|---|---|
| JP | 2007-335629 A | 12/2007 |
| JP | 2013-232667 A | 11/2013 |

OTHER PUBLICATIONS

International Preliminary Report on Patentability and English translation thereof dated Mar. 30, 2017 in connection with International Application No. PCT/JP2015/075463.

* cited by examiner

[FIG. 1]
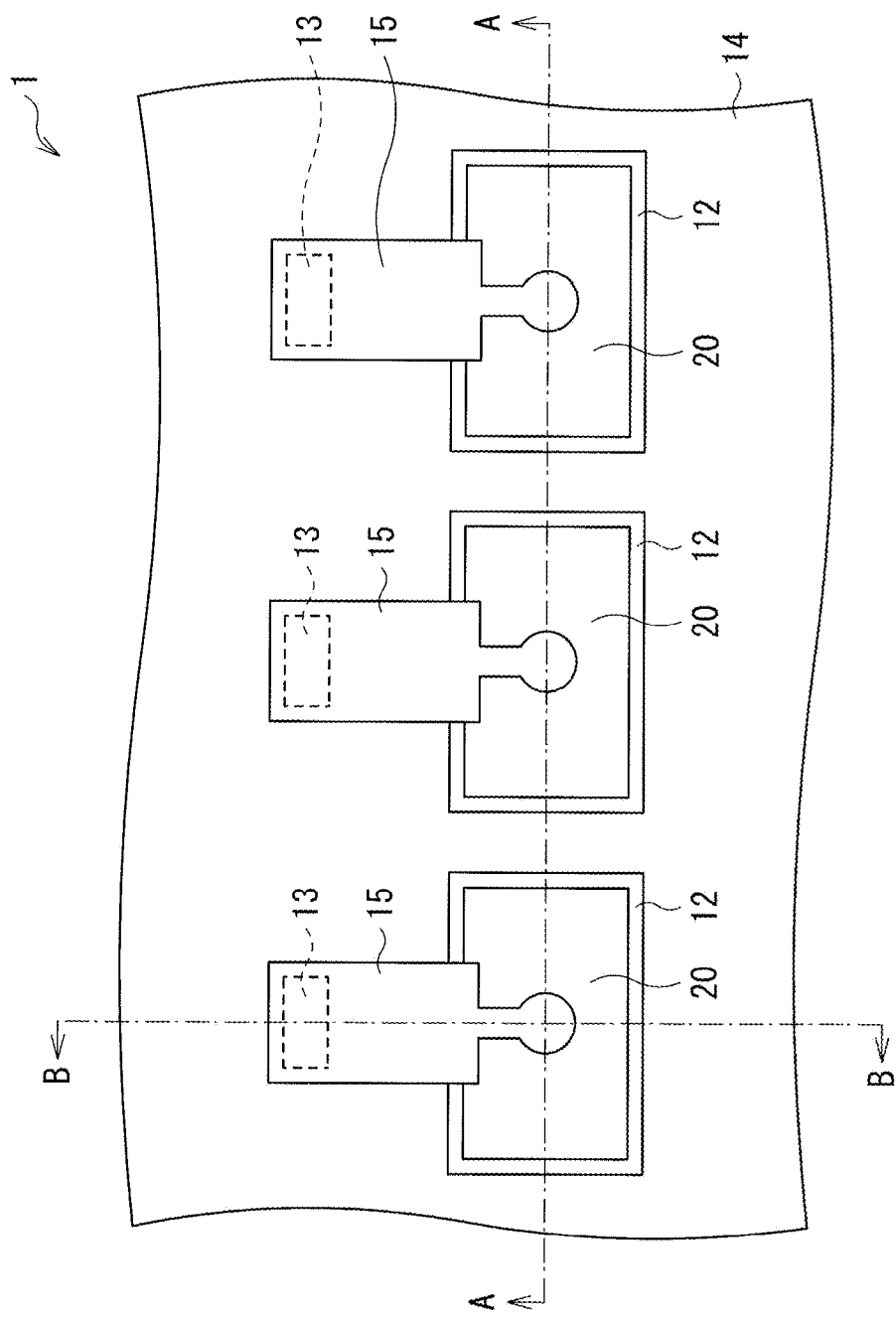

[FIG. 2]
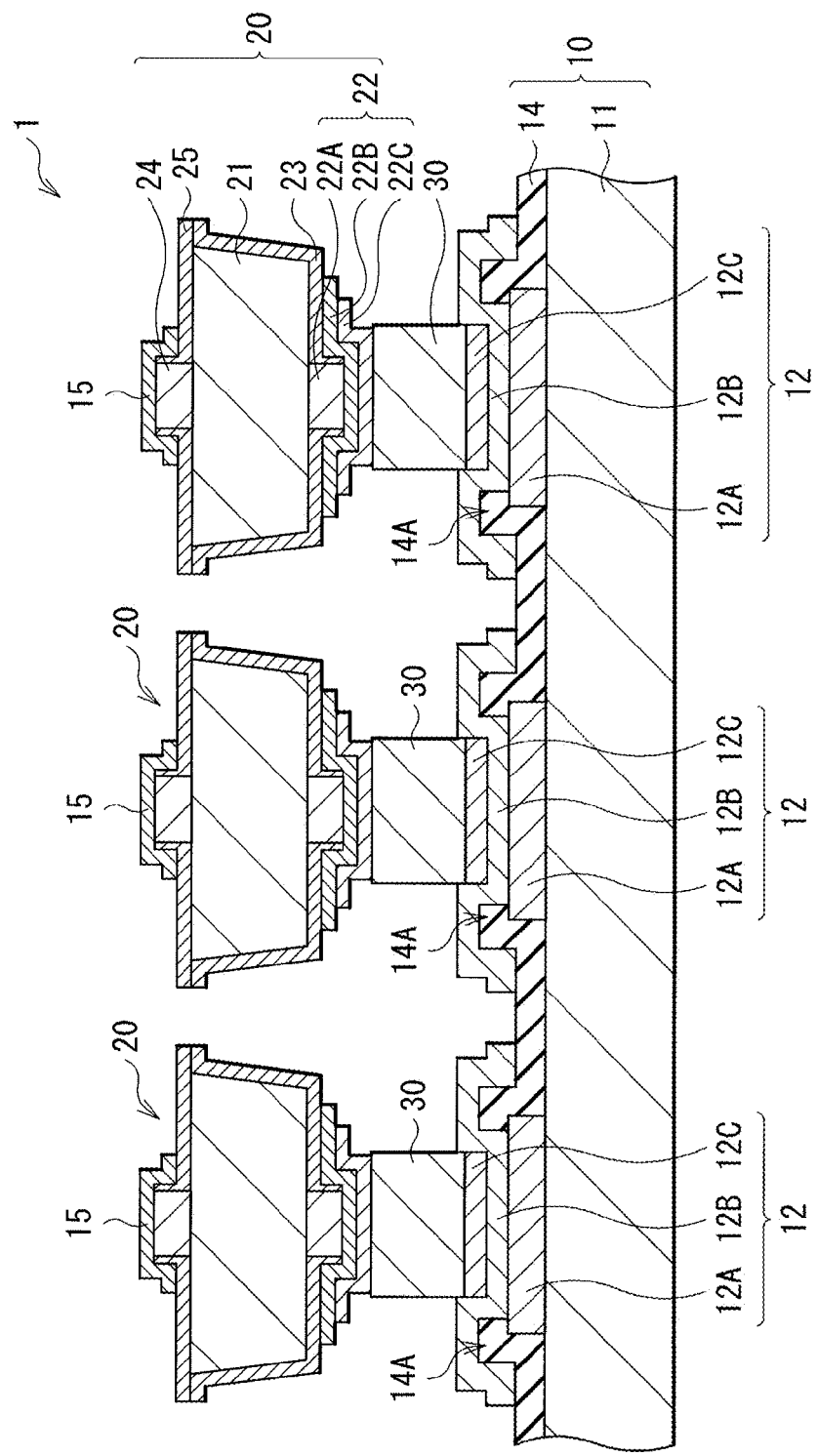

[FIG. 3]
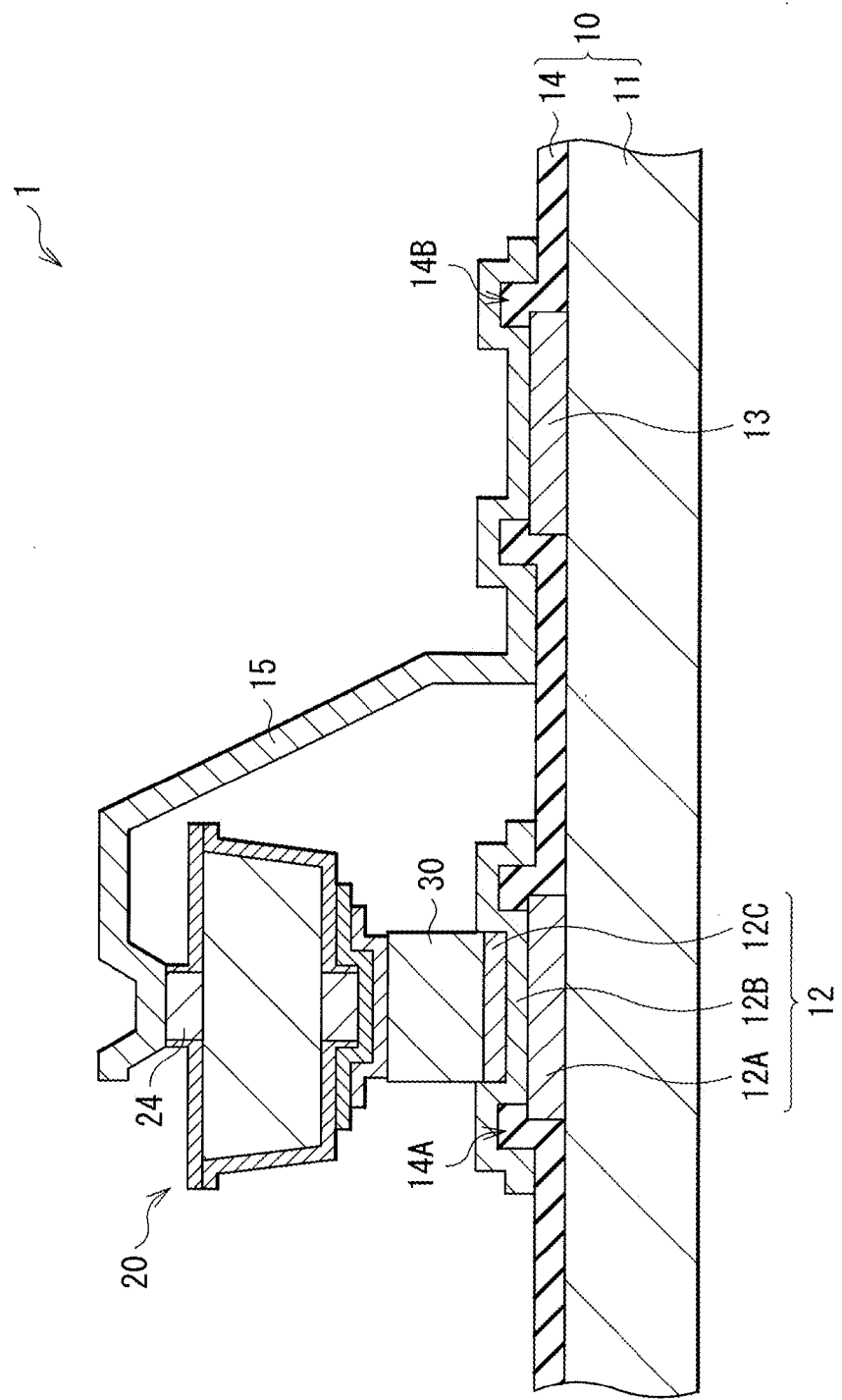

[ FIG. 4 ]
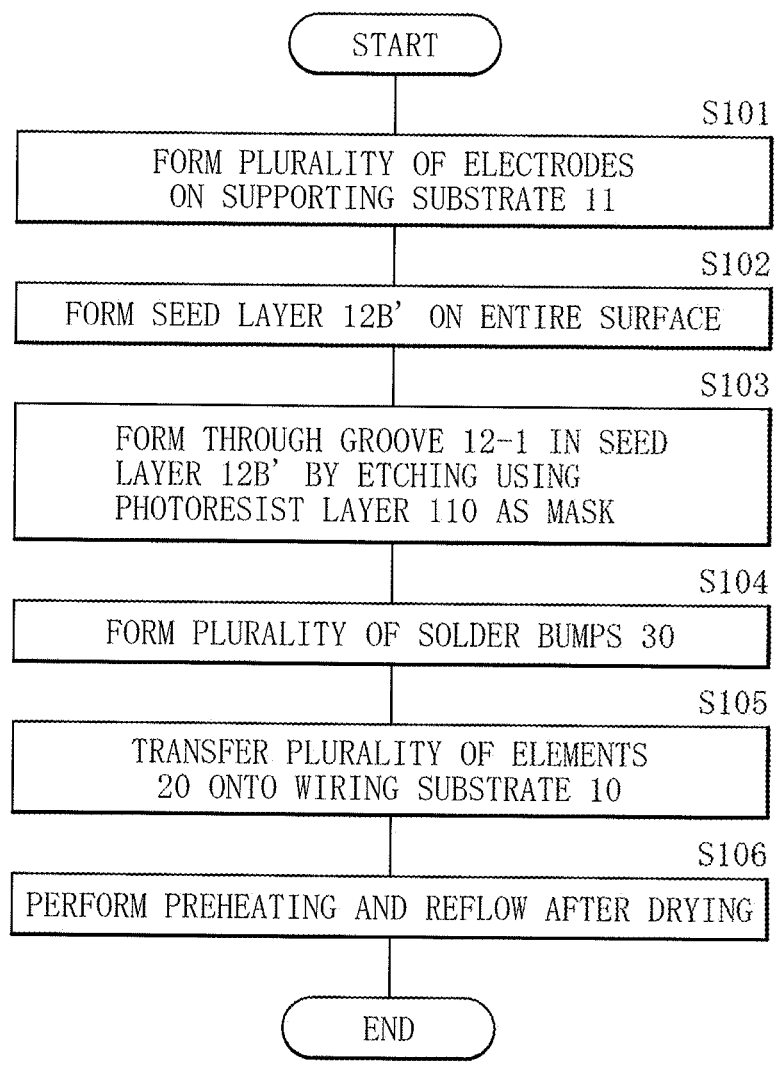

[FIG. 5]
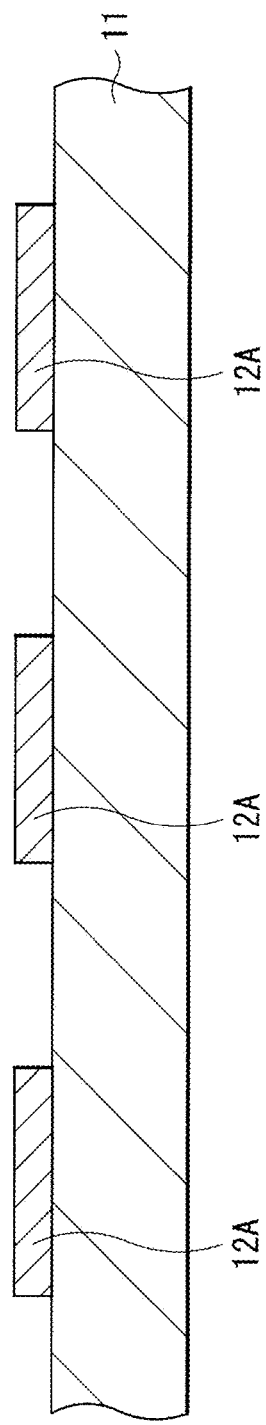

[ FIG. 6 ]
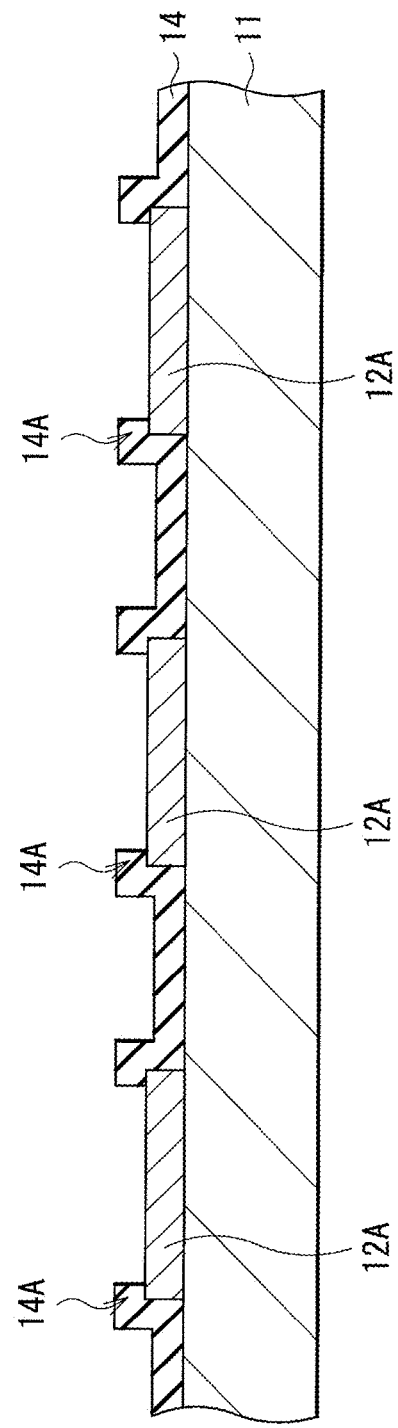

[FIG. 7]
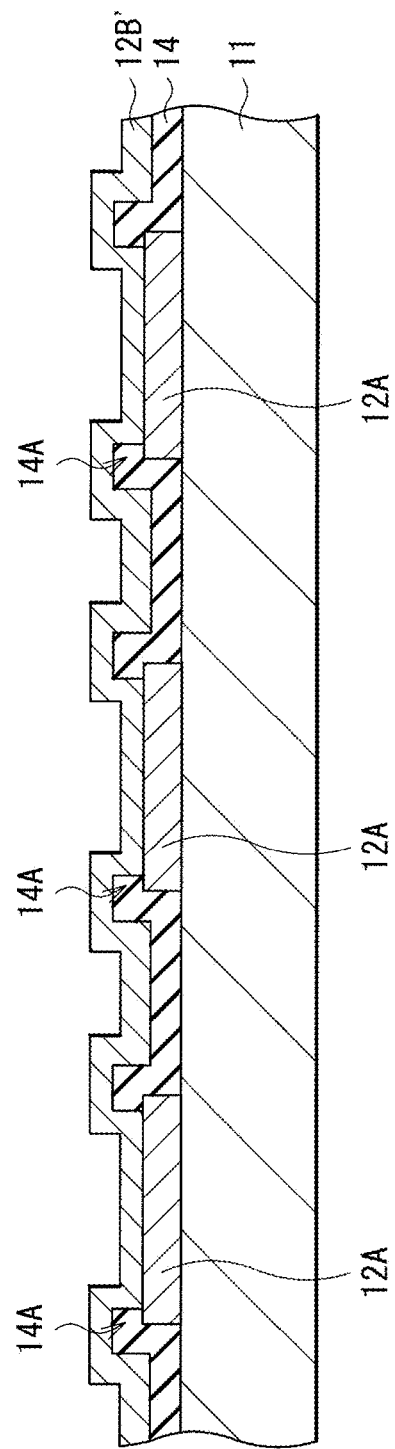

[ FIG. 8A ]
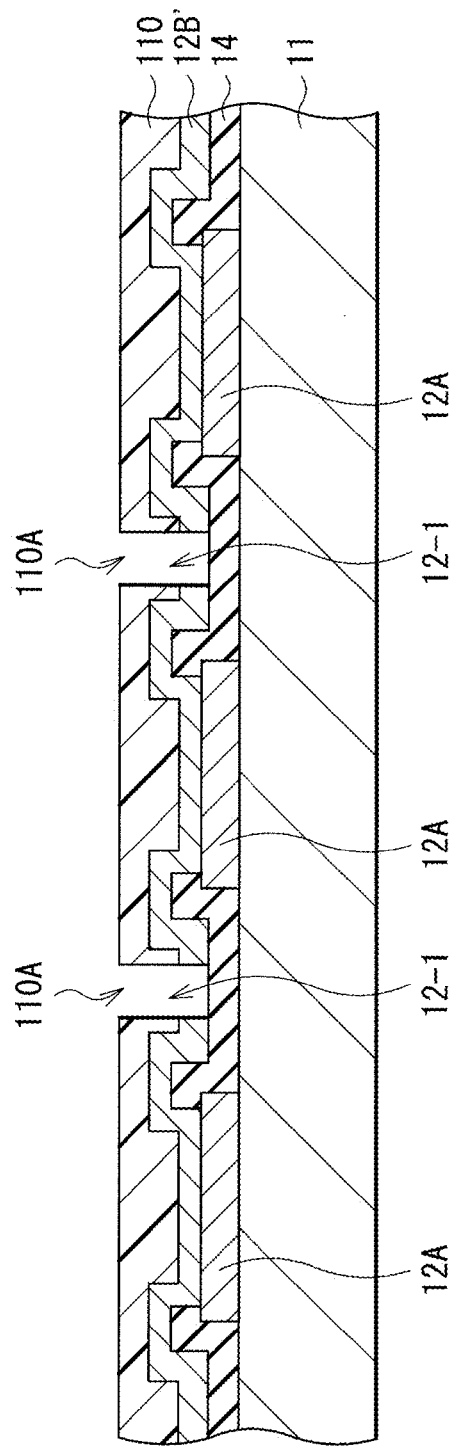

[FIG. 8B]
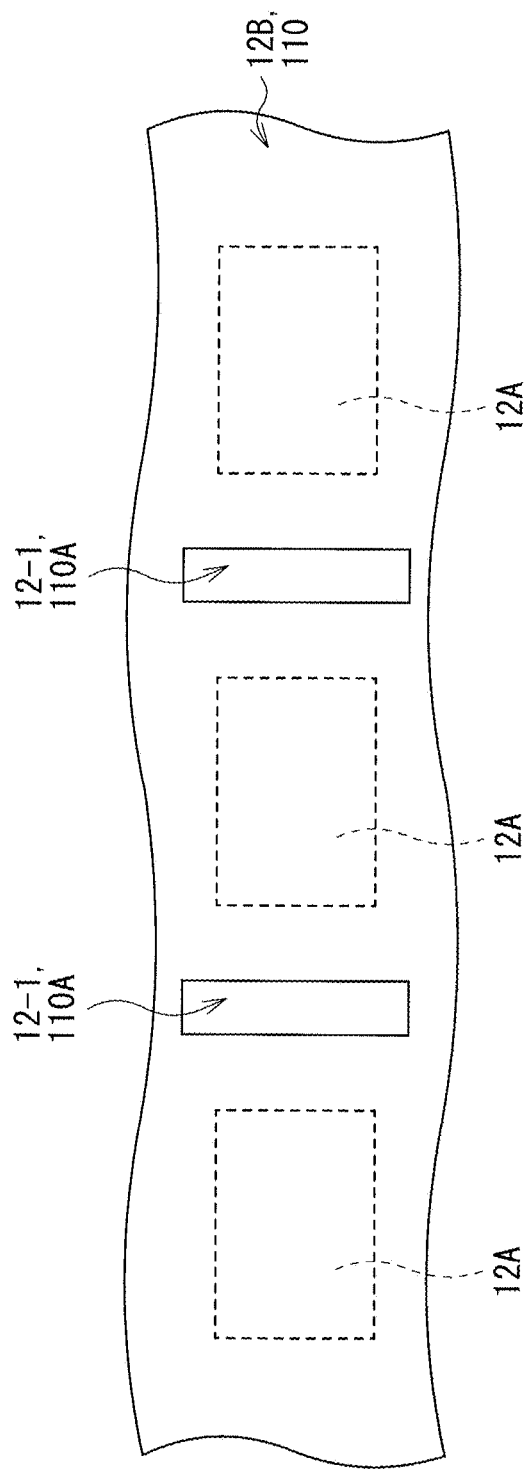

[ FIG. 9 ]
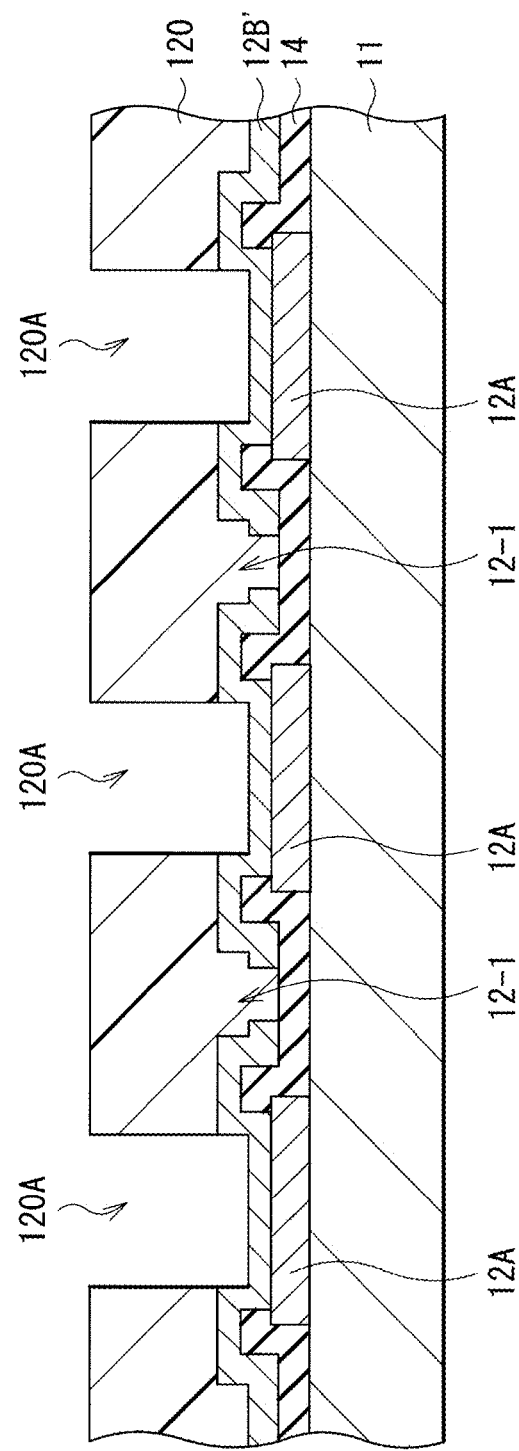

[ FIG. 10 ]
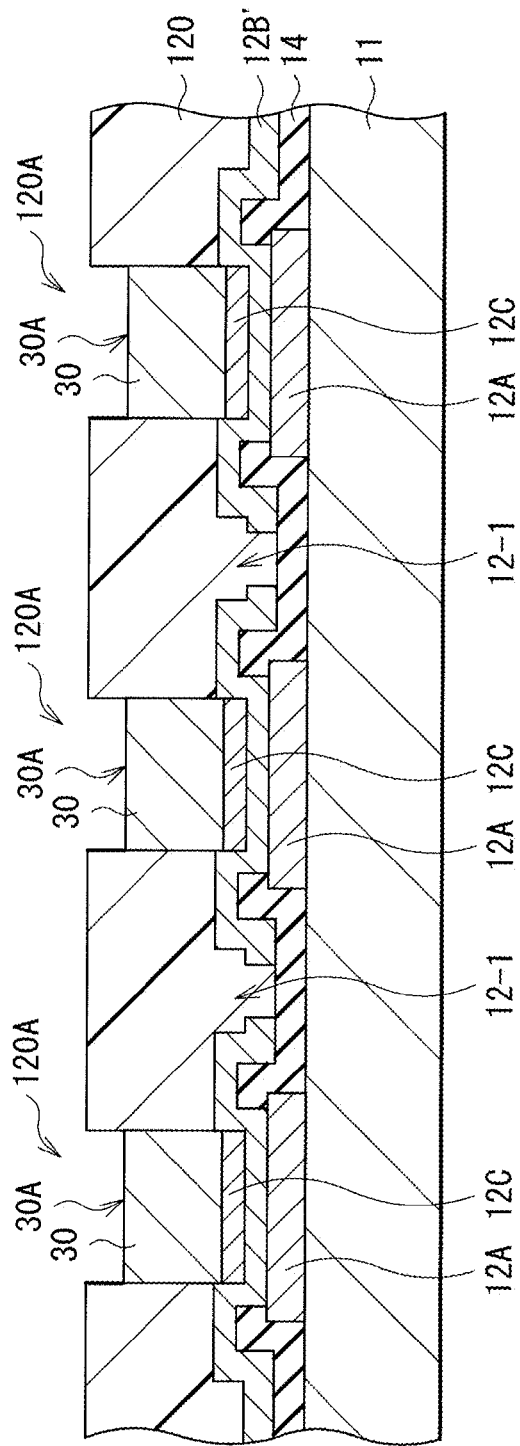

[ FIG. 11A ]
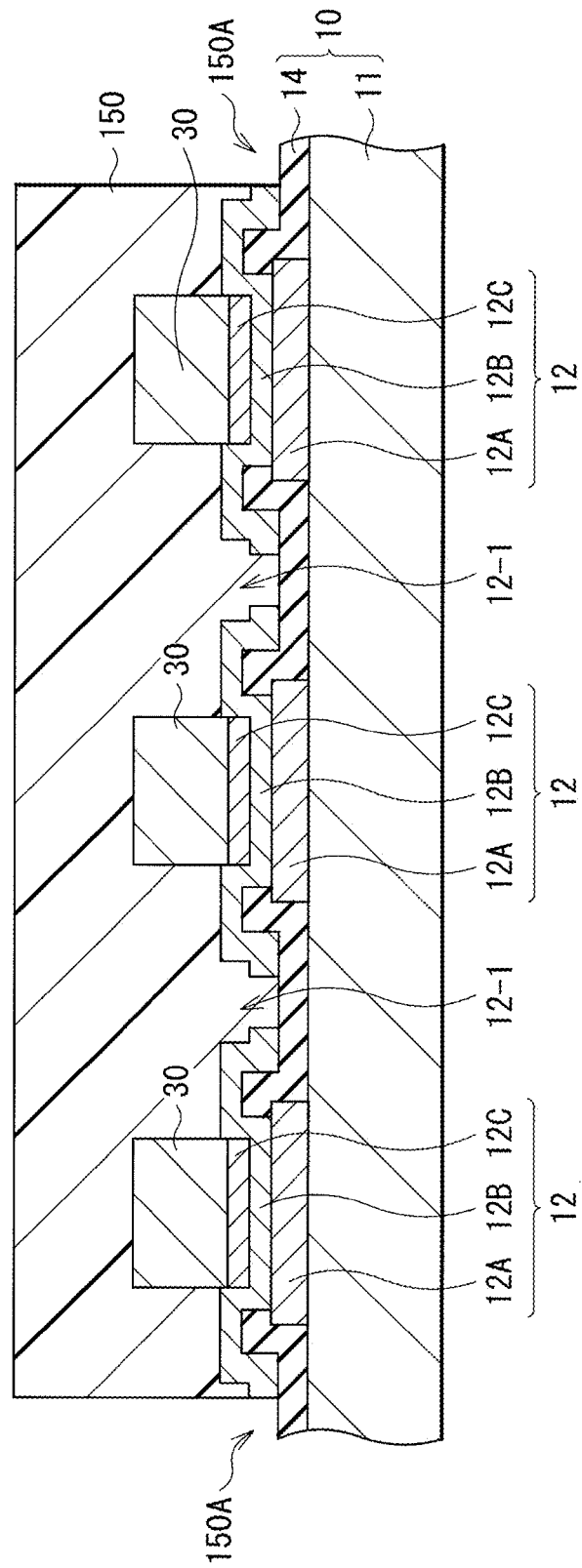

[ FIG. 11B ]
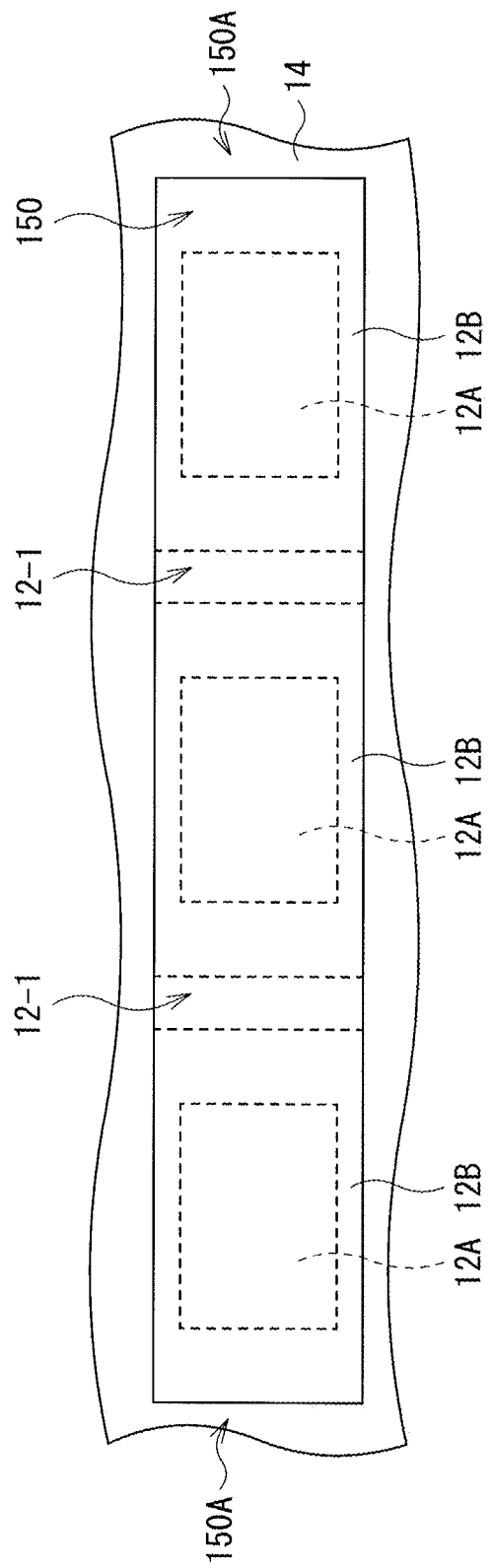

[ FIG. 12 ]
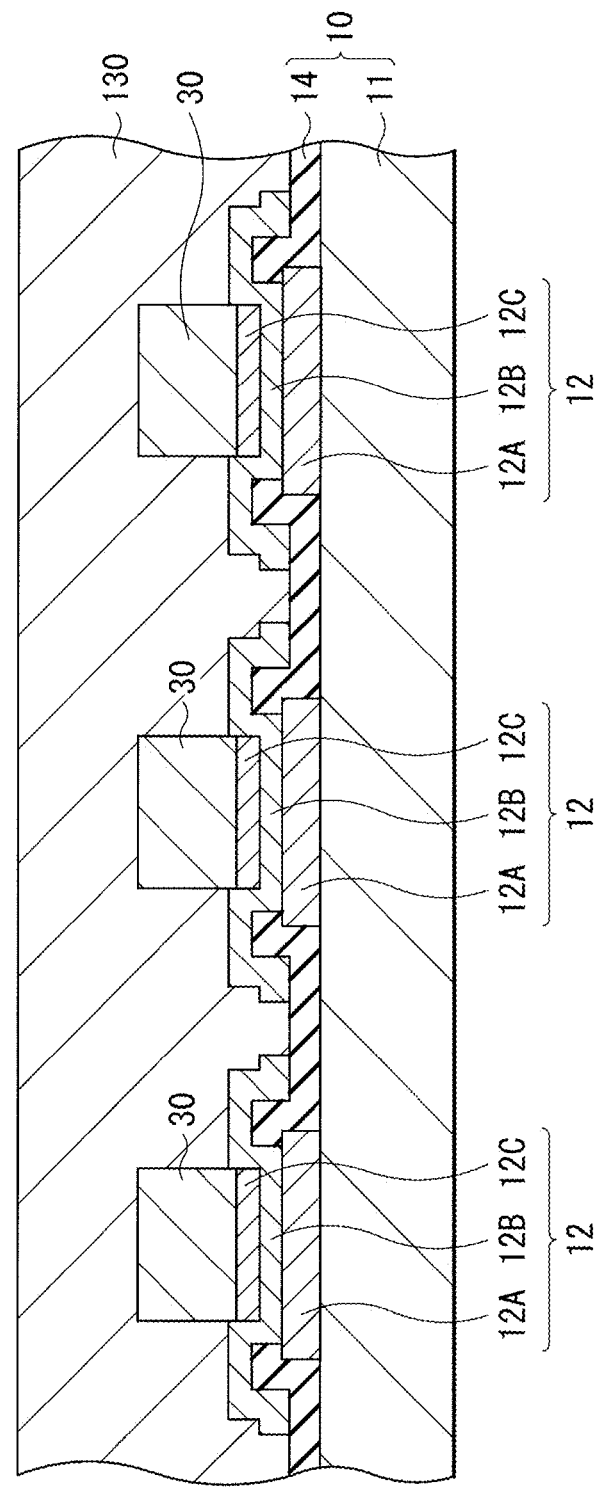

[FIG. 13]
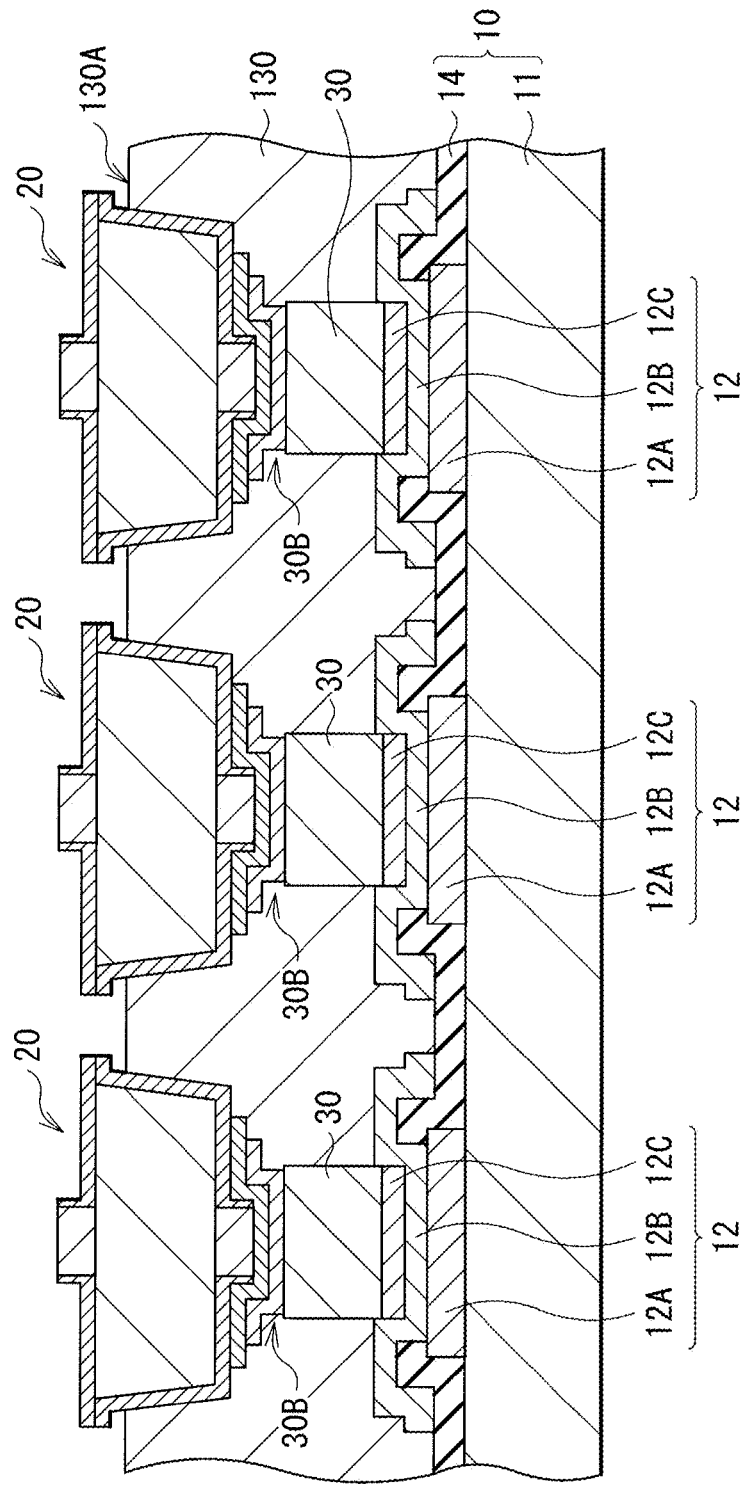

[FIG. 14]
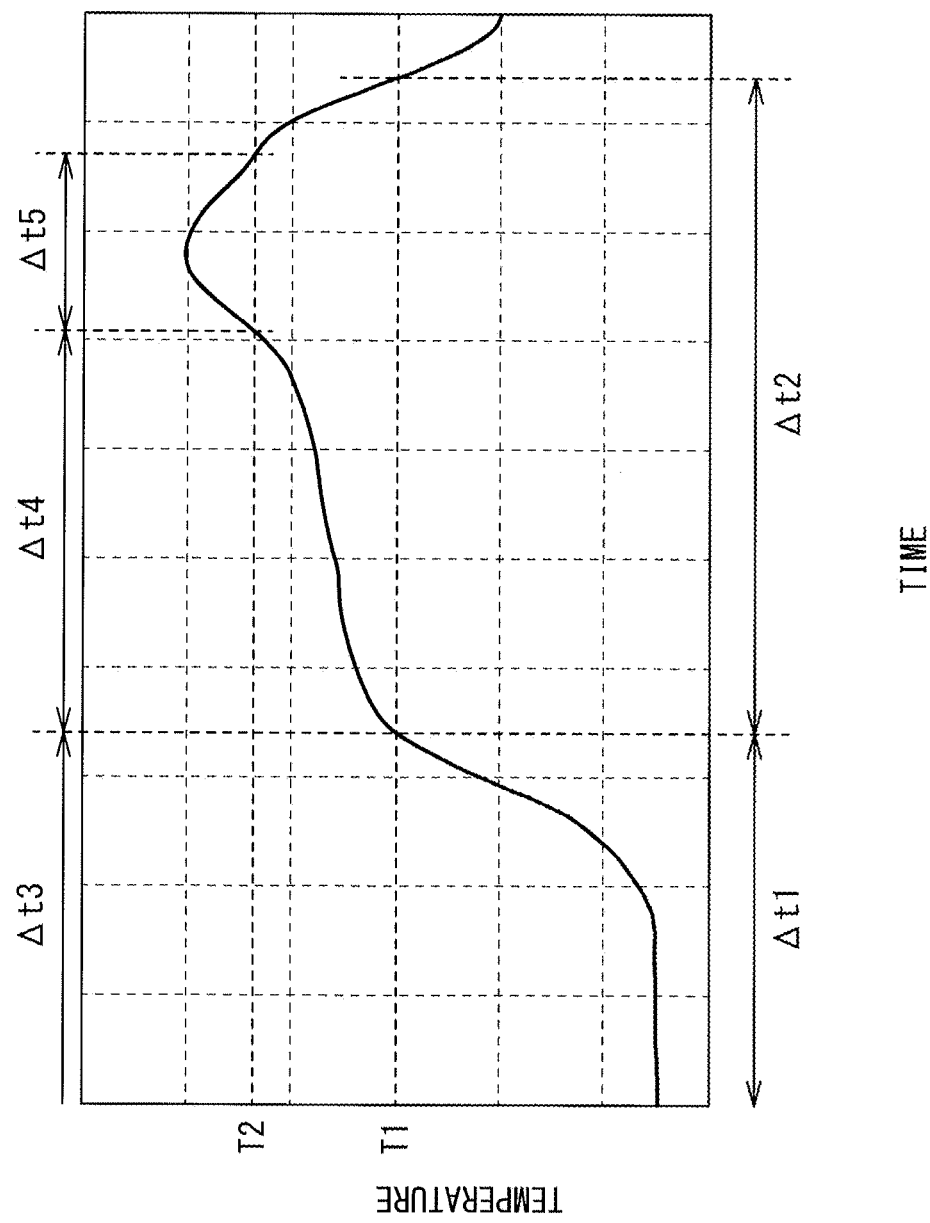

[ FIG. 15 ]
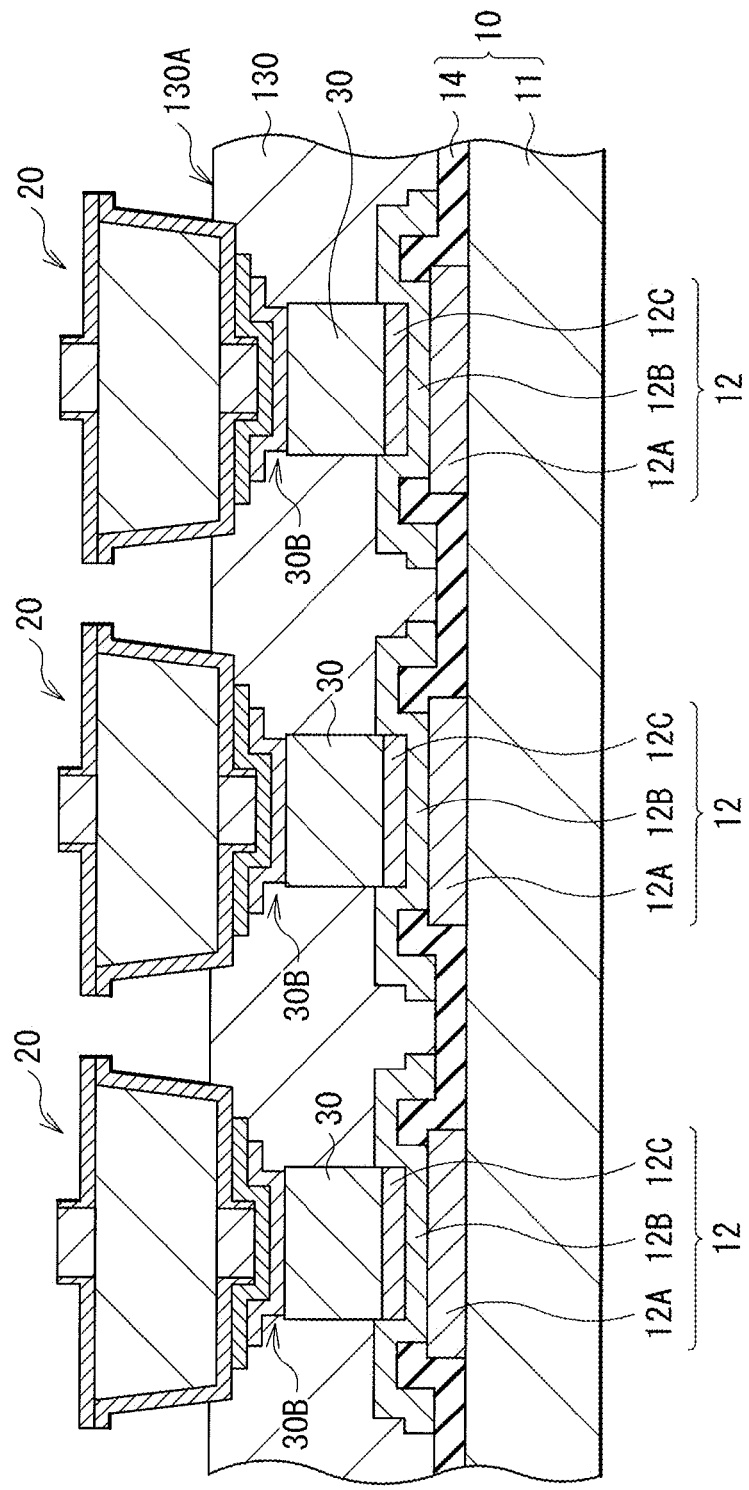

[FIG. 16]
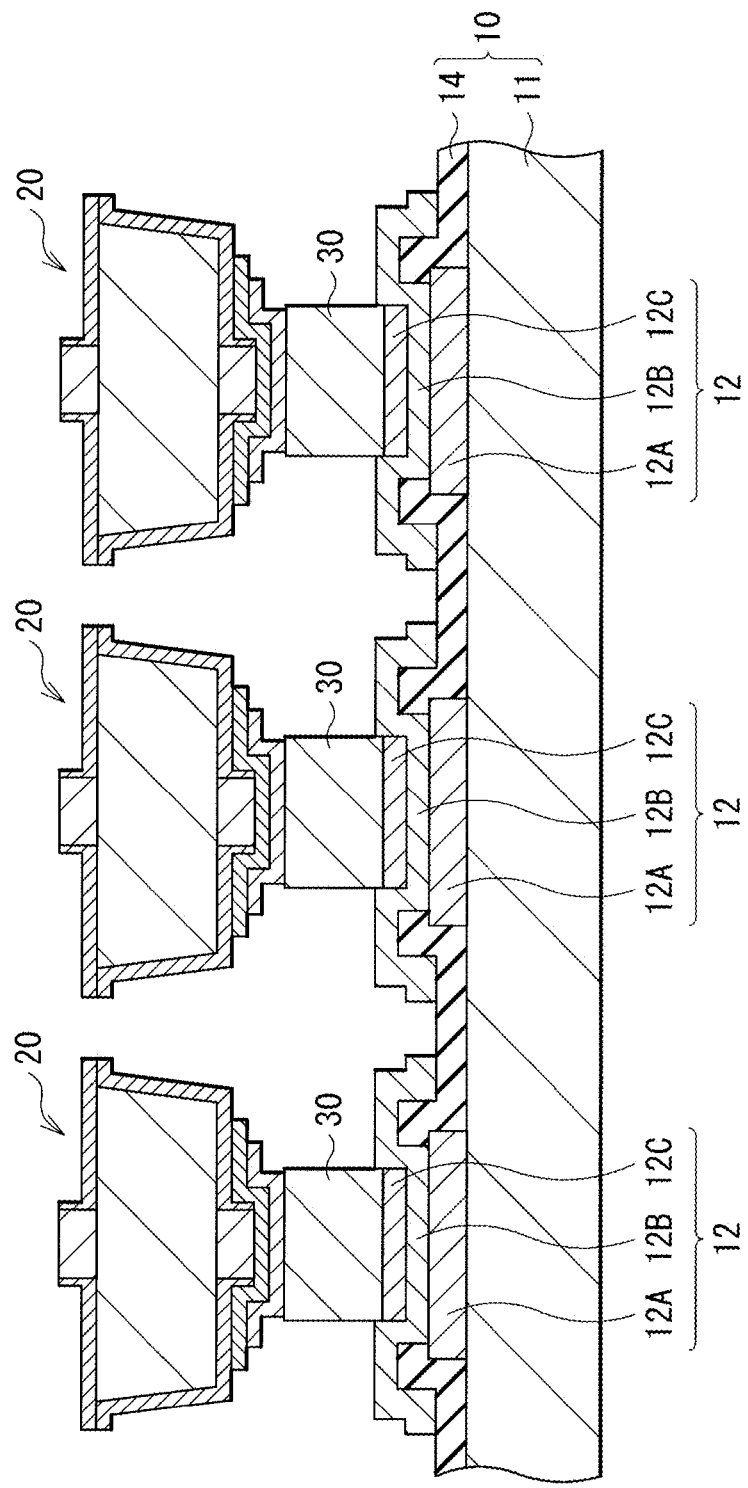

[ FIG. 17 ]
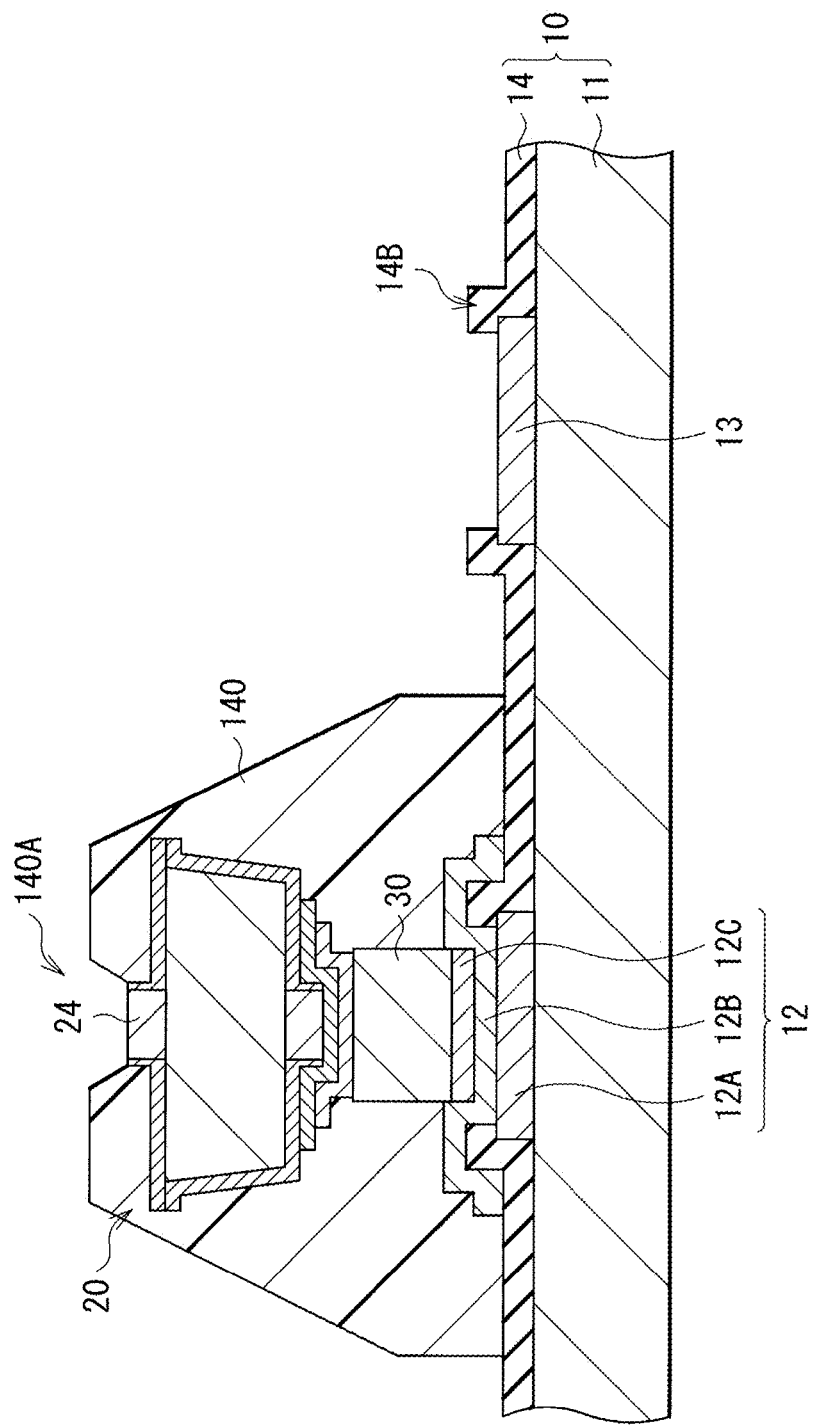

[ FIG. 18 ]
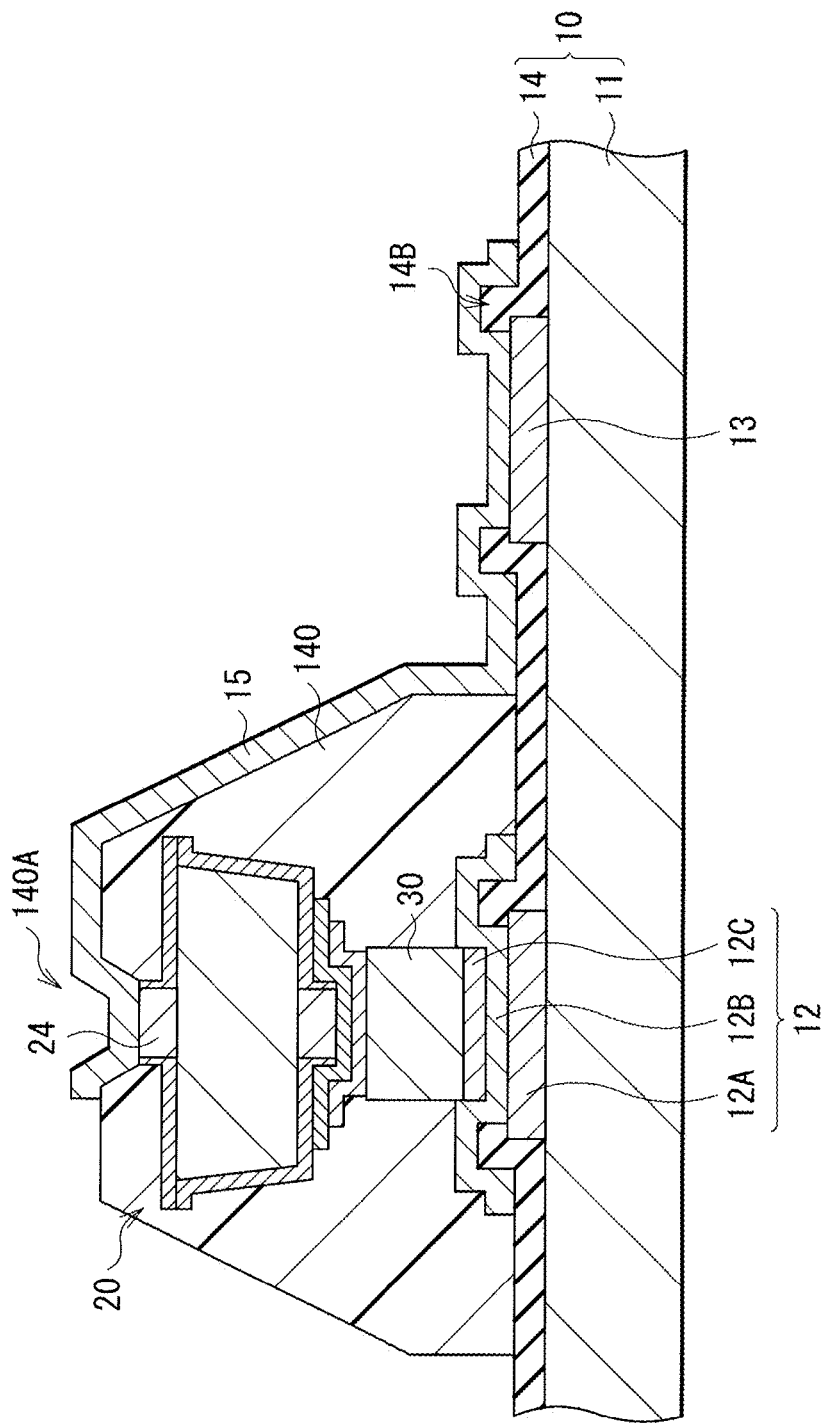

[ FIG. 19 ]
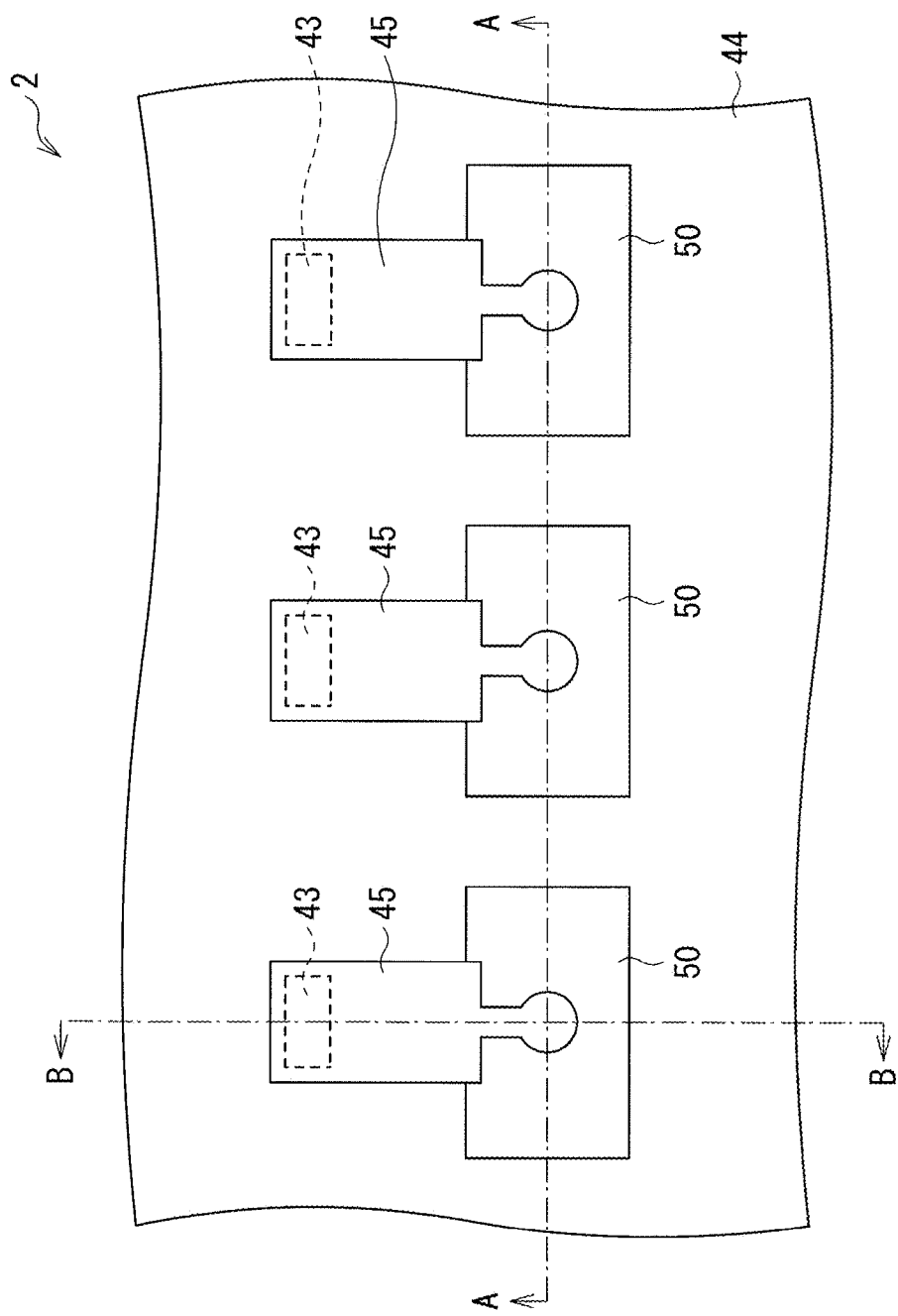

[FIG. 20]
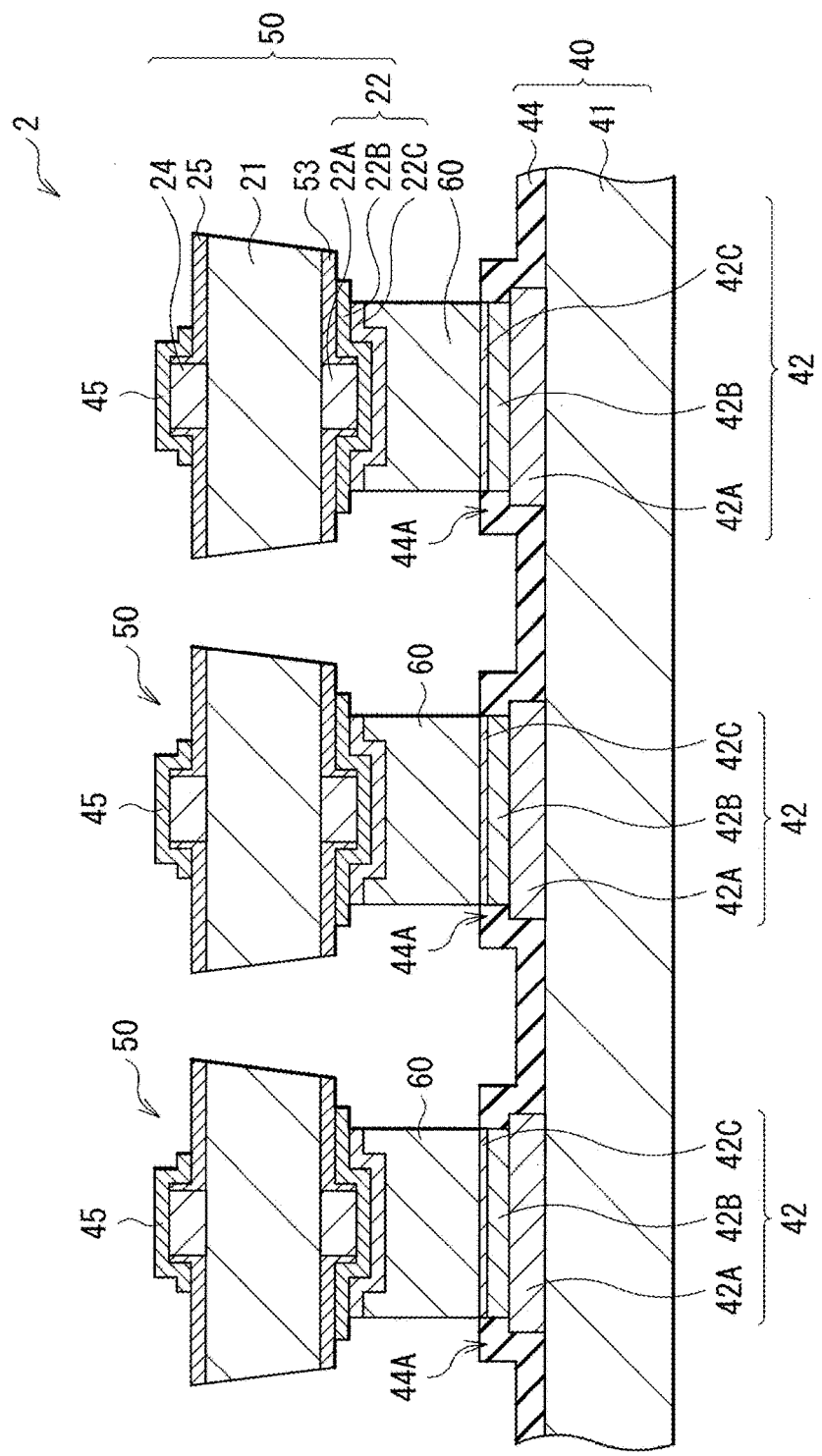

[ FIG. 21 ]
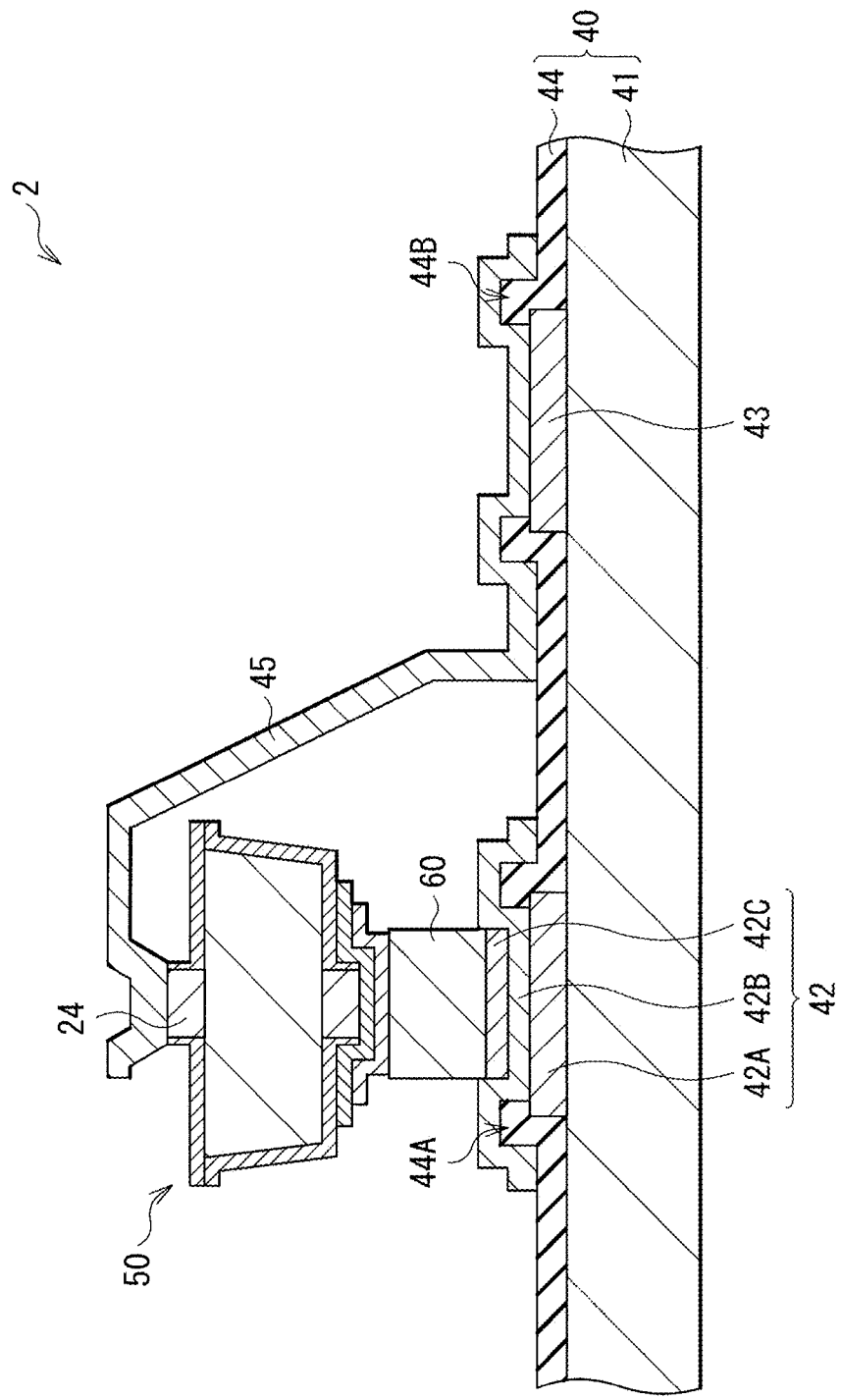

[ FIG. 22 ]
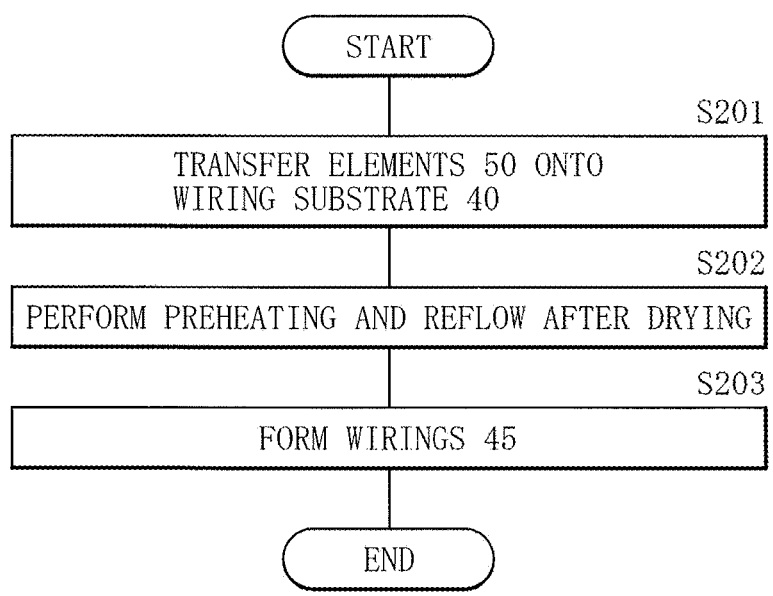

[ FIG. 23 ]
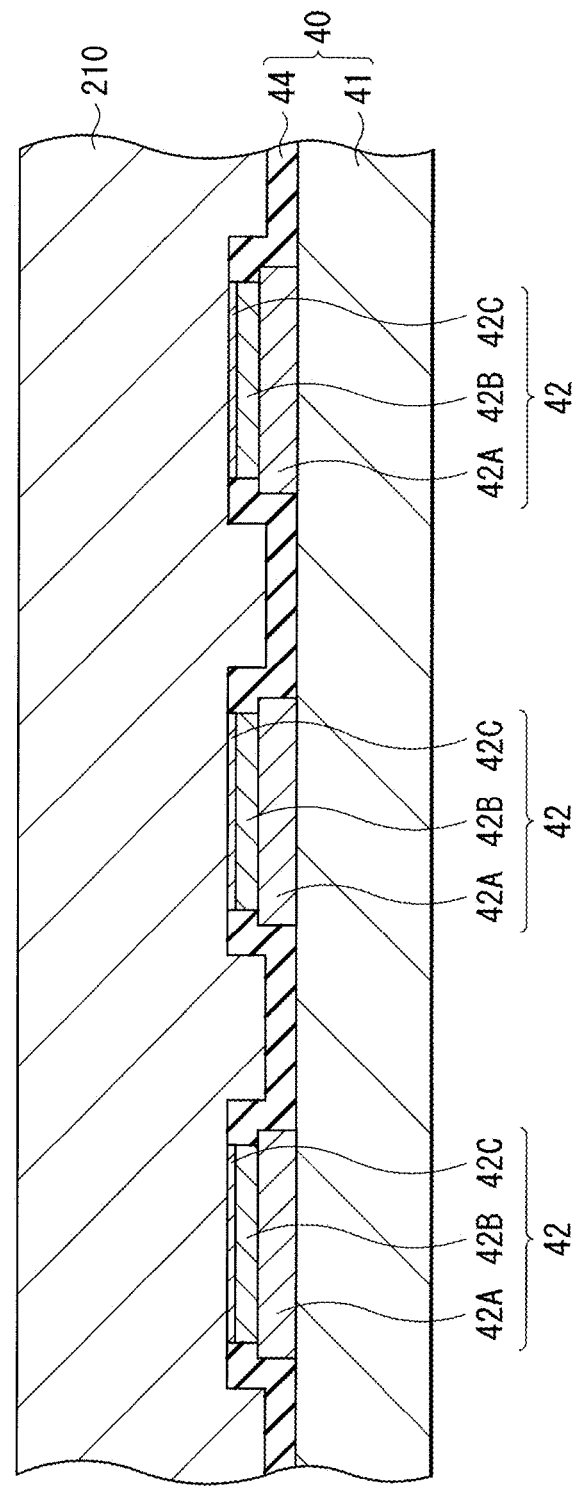

[FIG. 24]
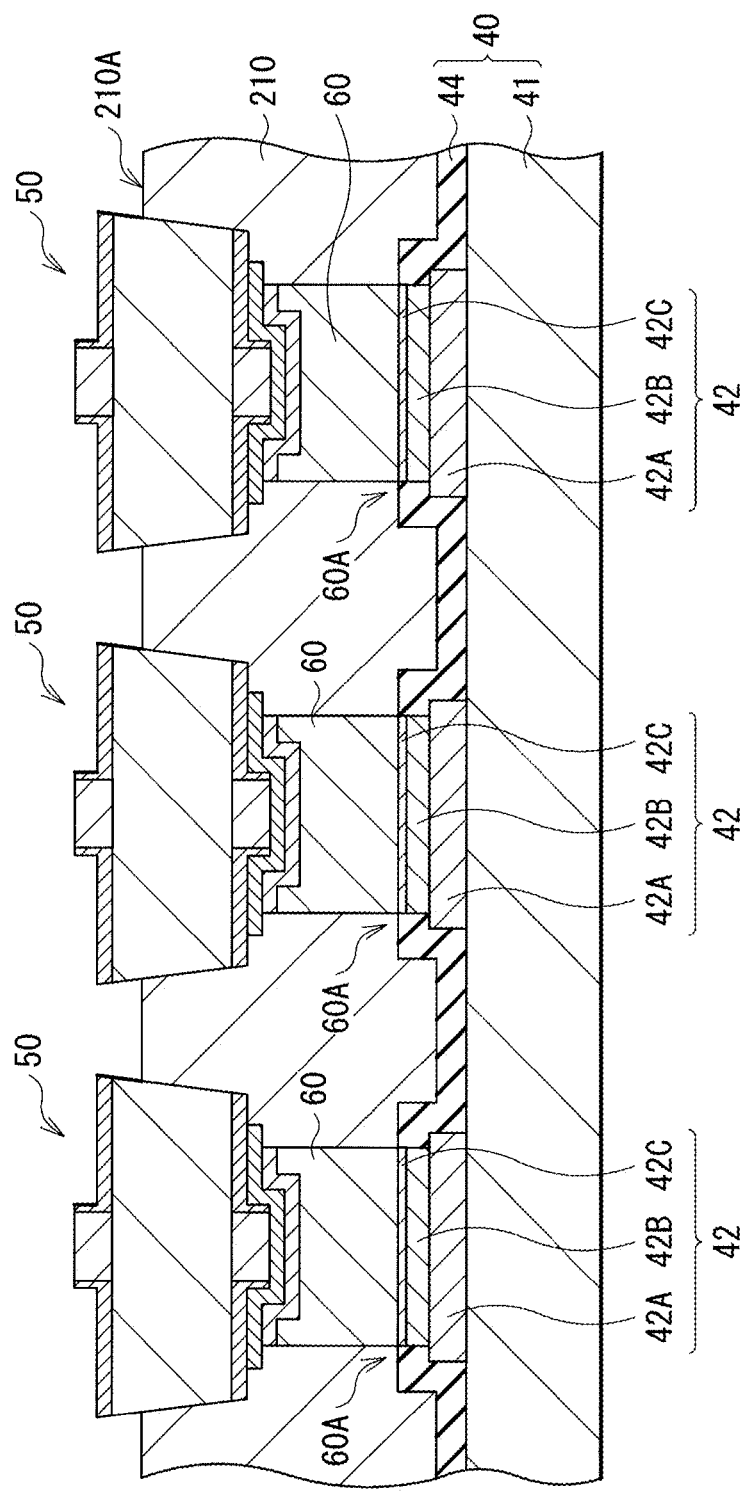

[FIG. 25]
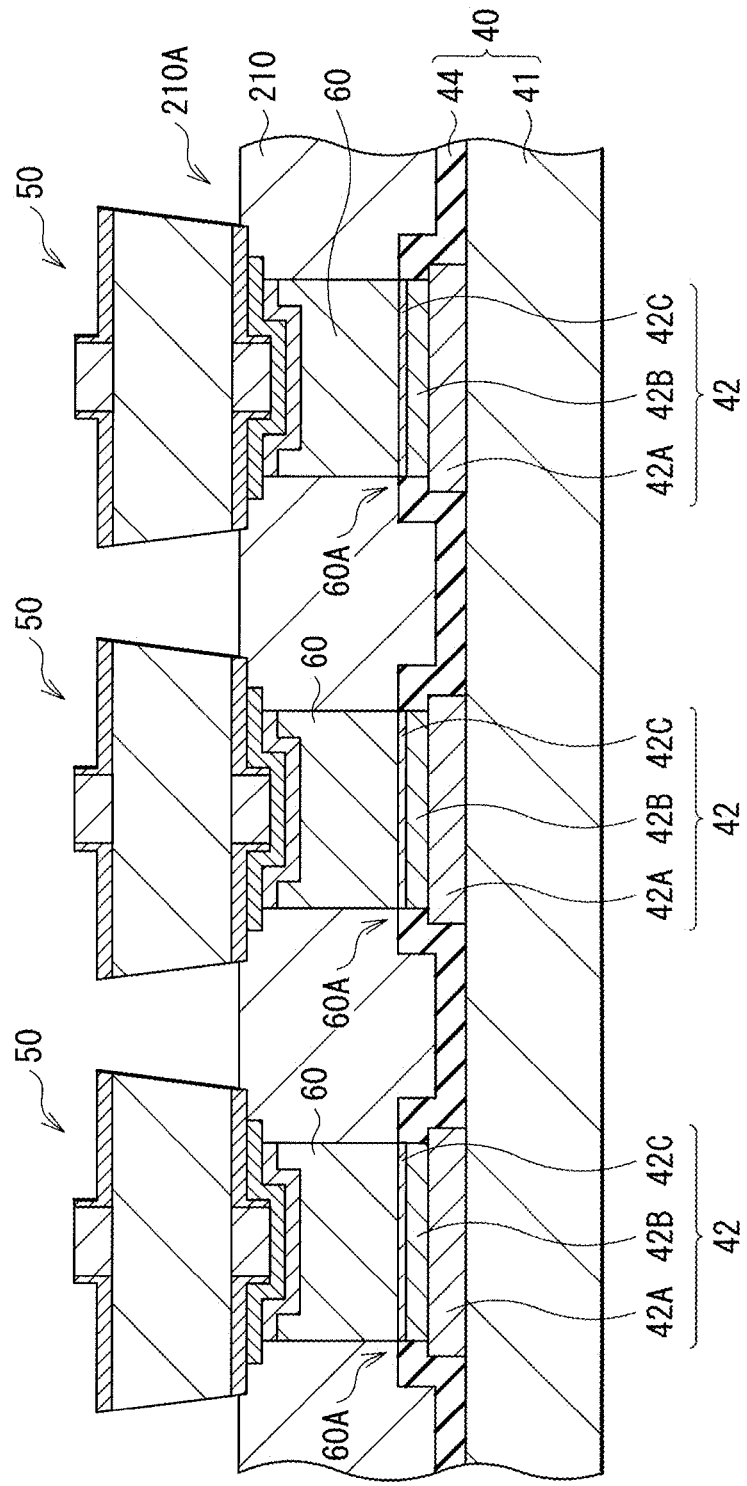

[ FIG. 26 ]
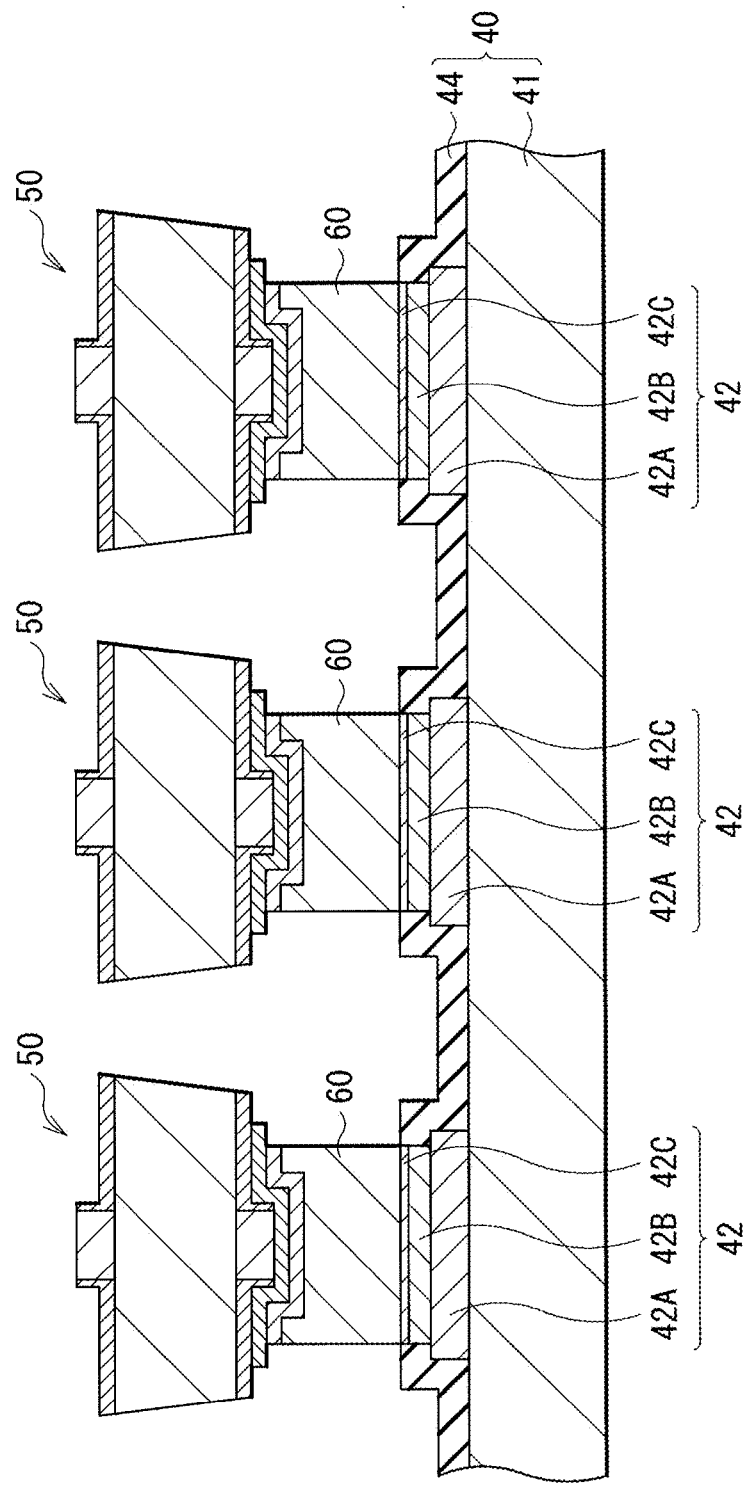

[ FIG. 27 ]
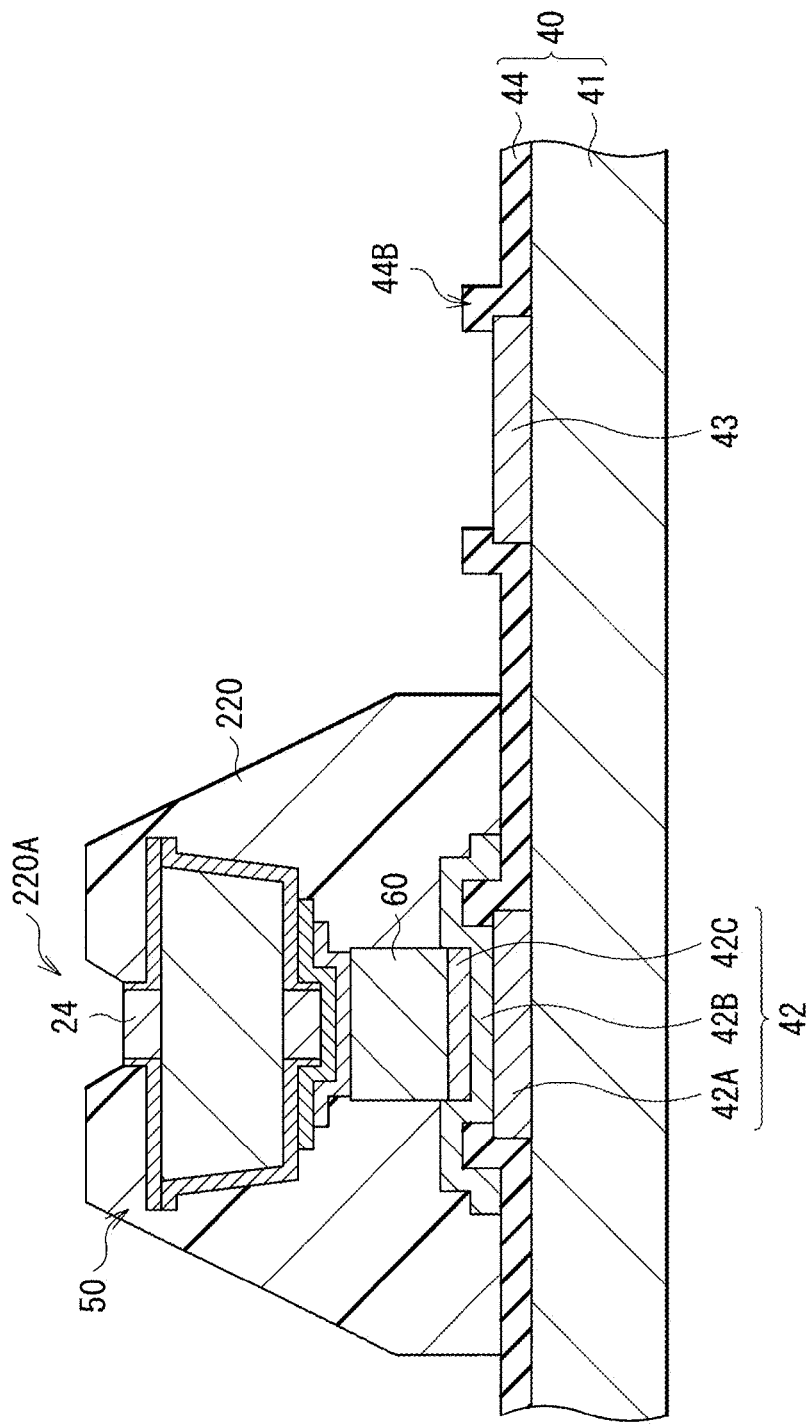

[ FIG. 28 ]
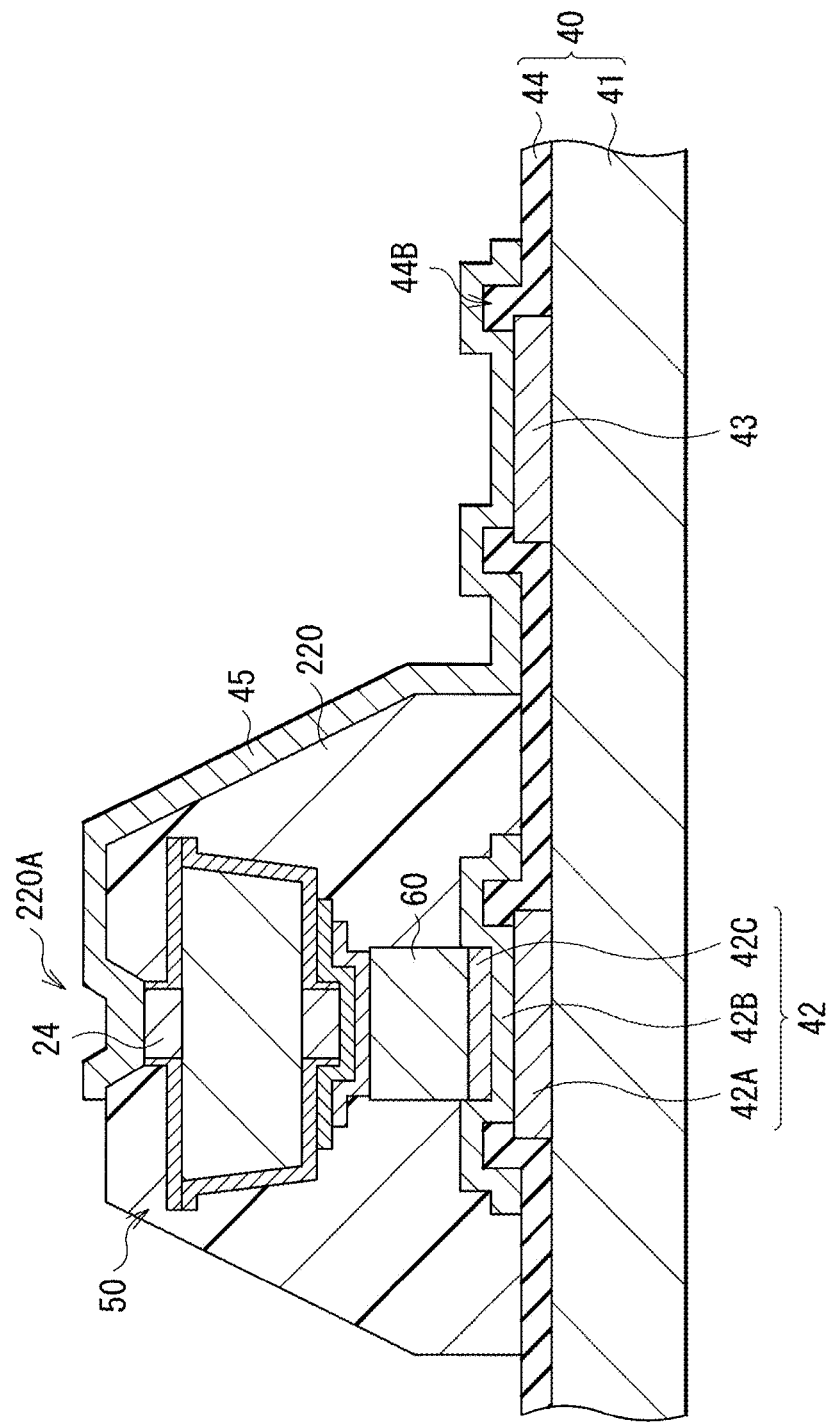

[ FIG. 29 ]
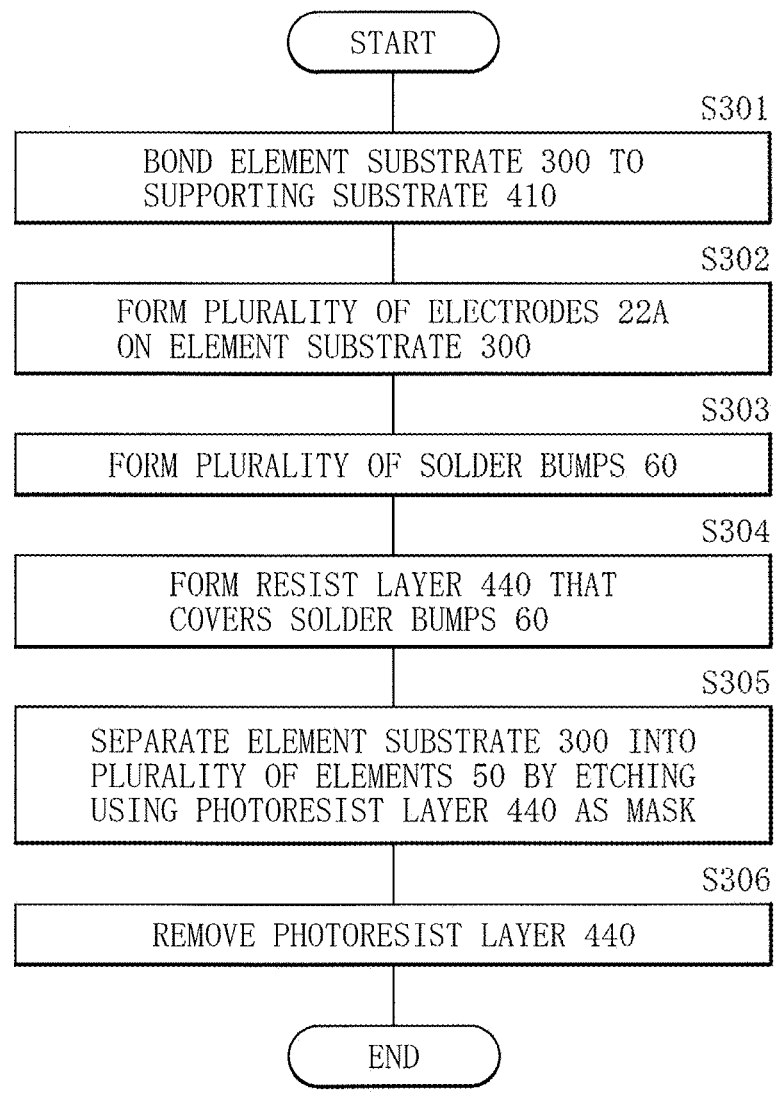

[ FIG. 30 ]
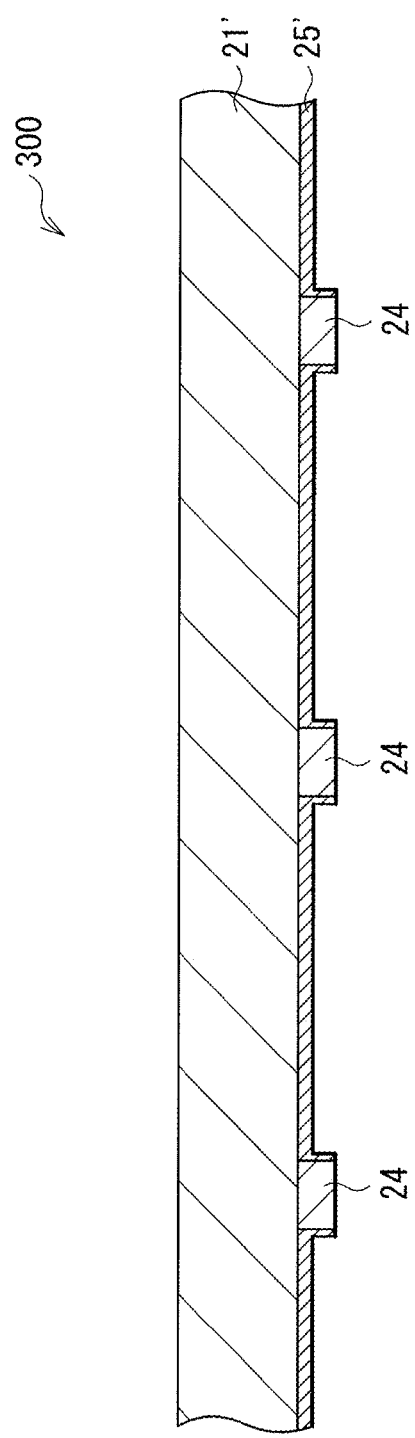

[ FIG. 31 ]
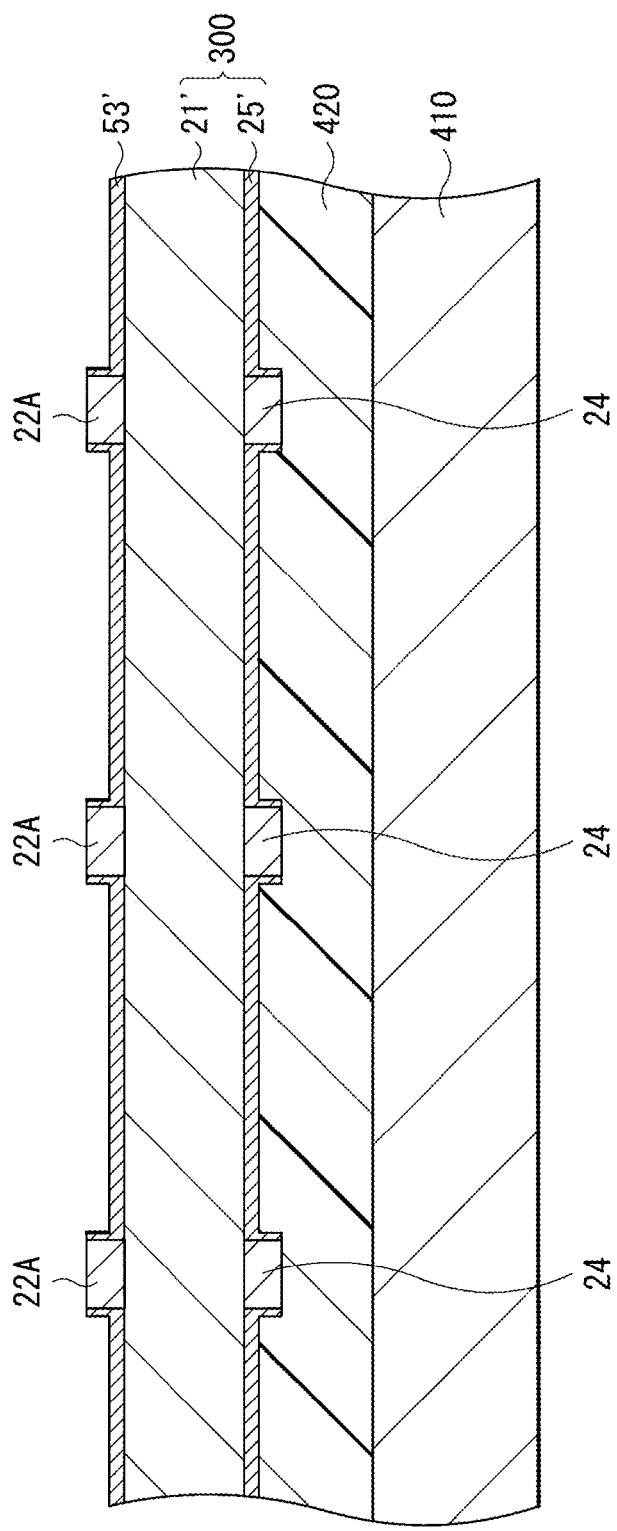

[ FIG. 32 ]
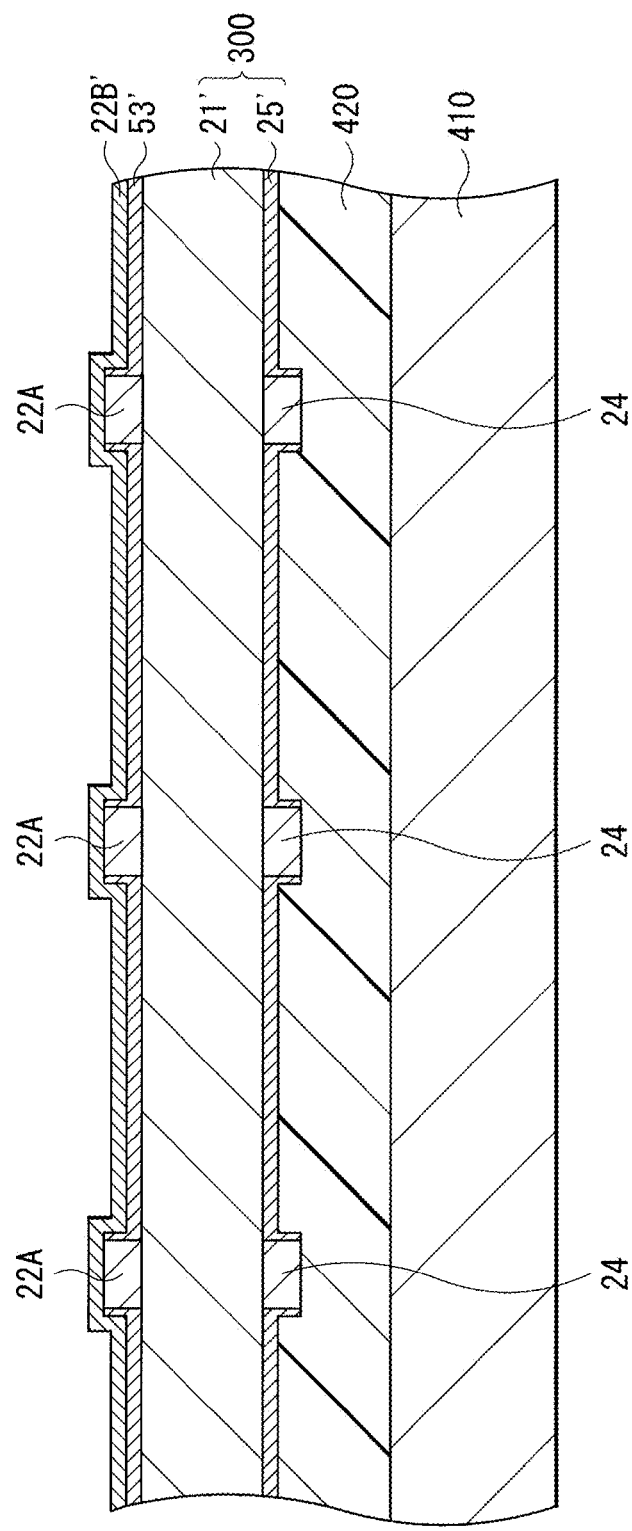

[FIG. 33]
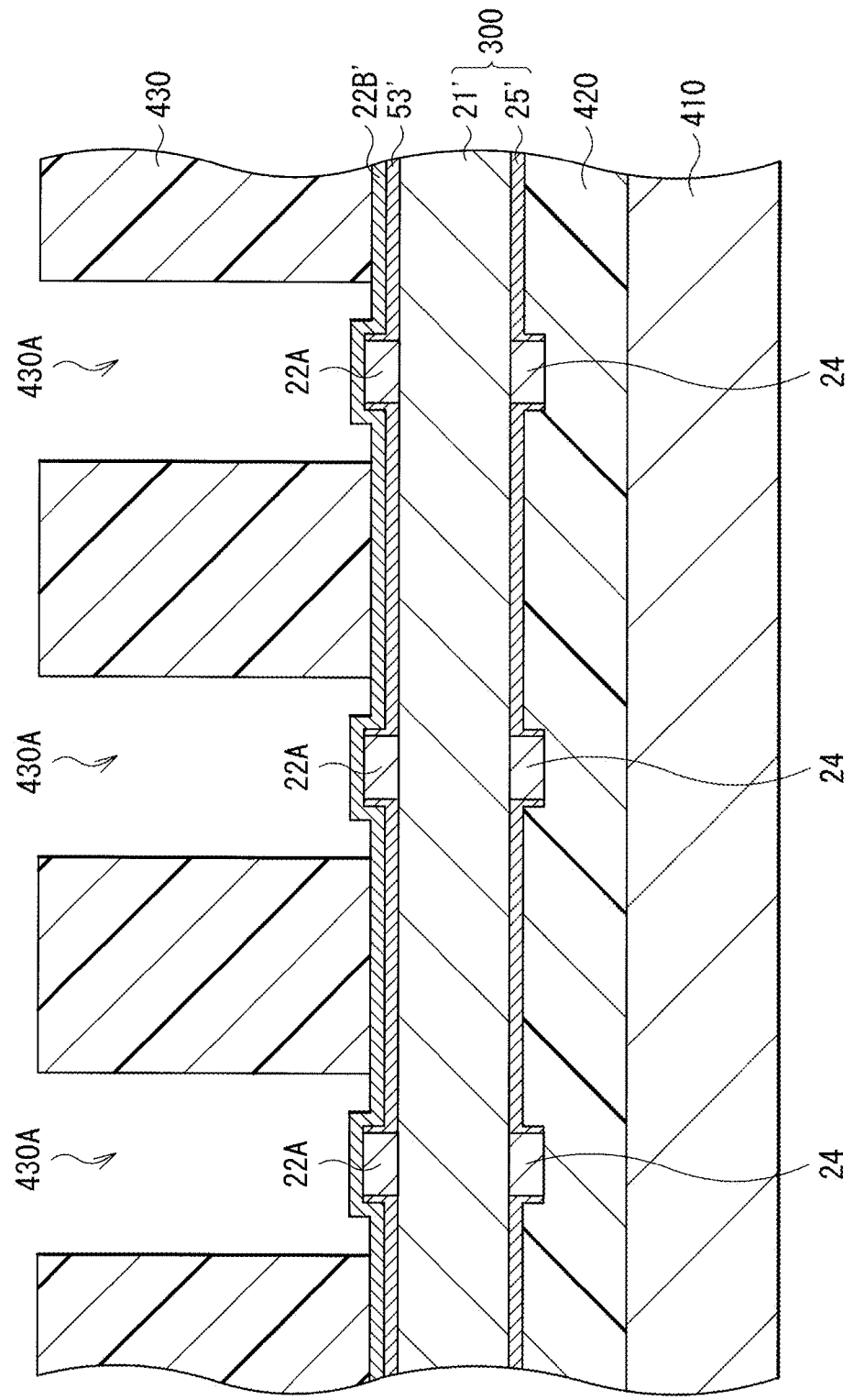

[FIG. 34]
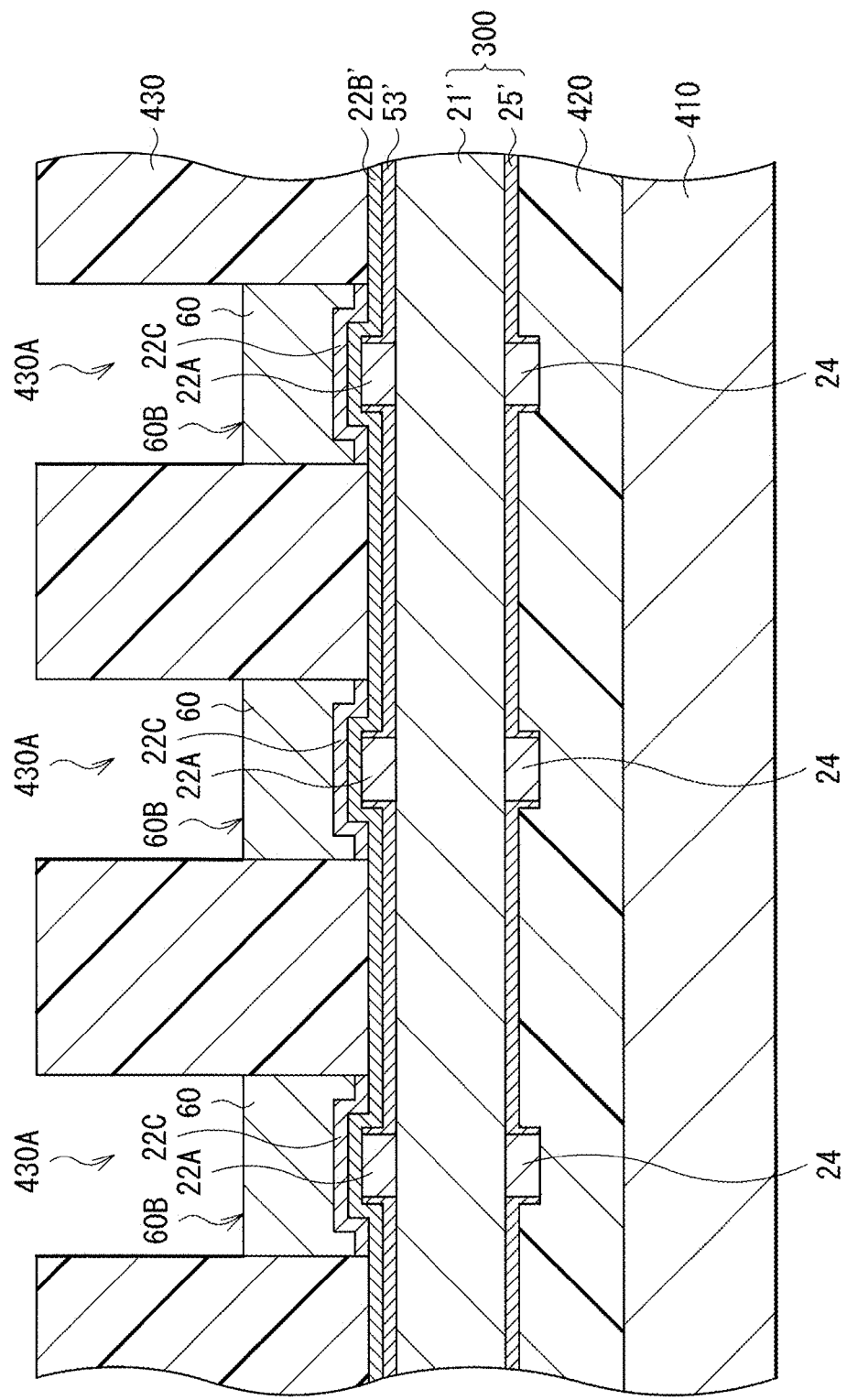

[FIG. 35]
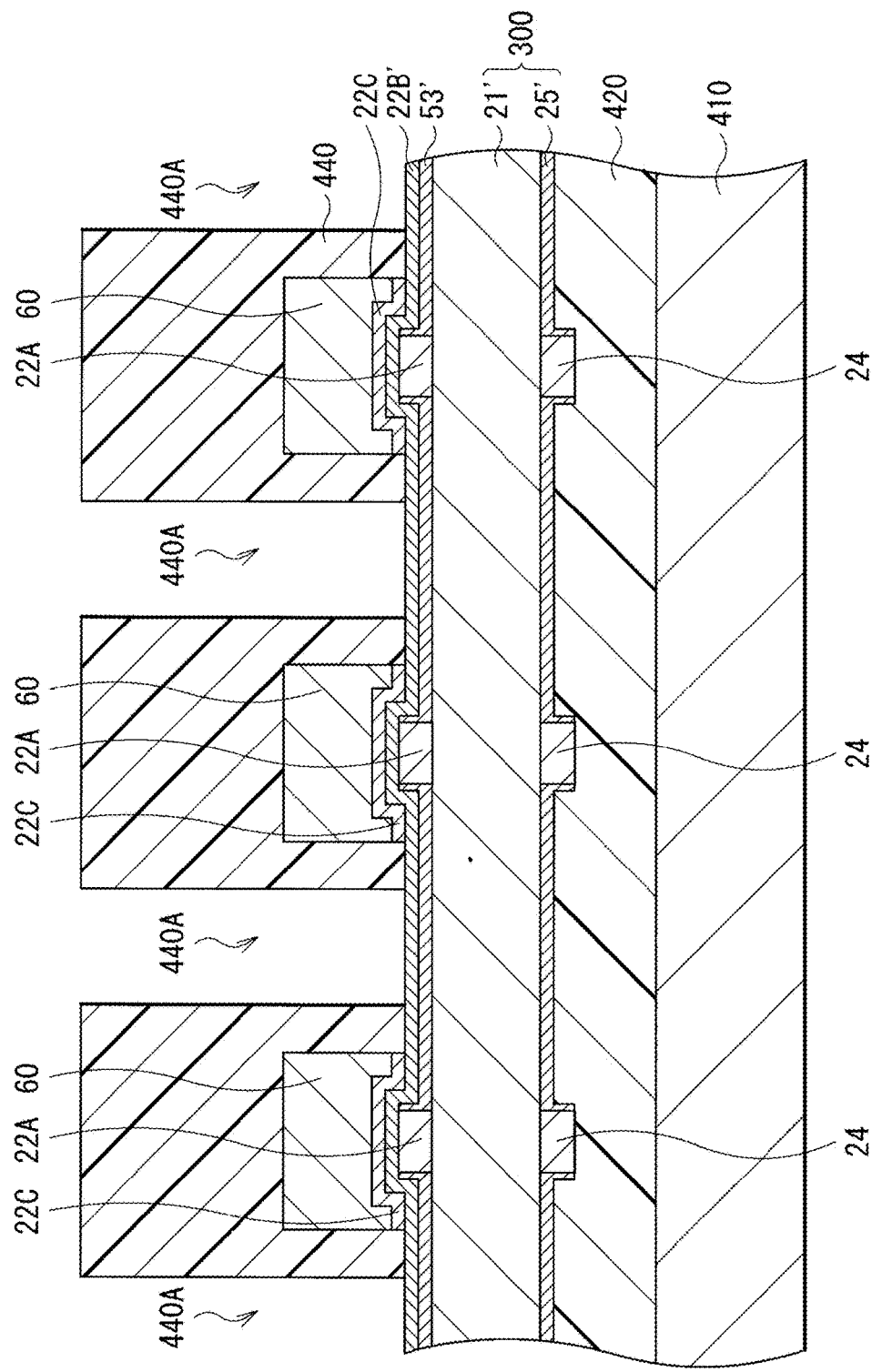

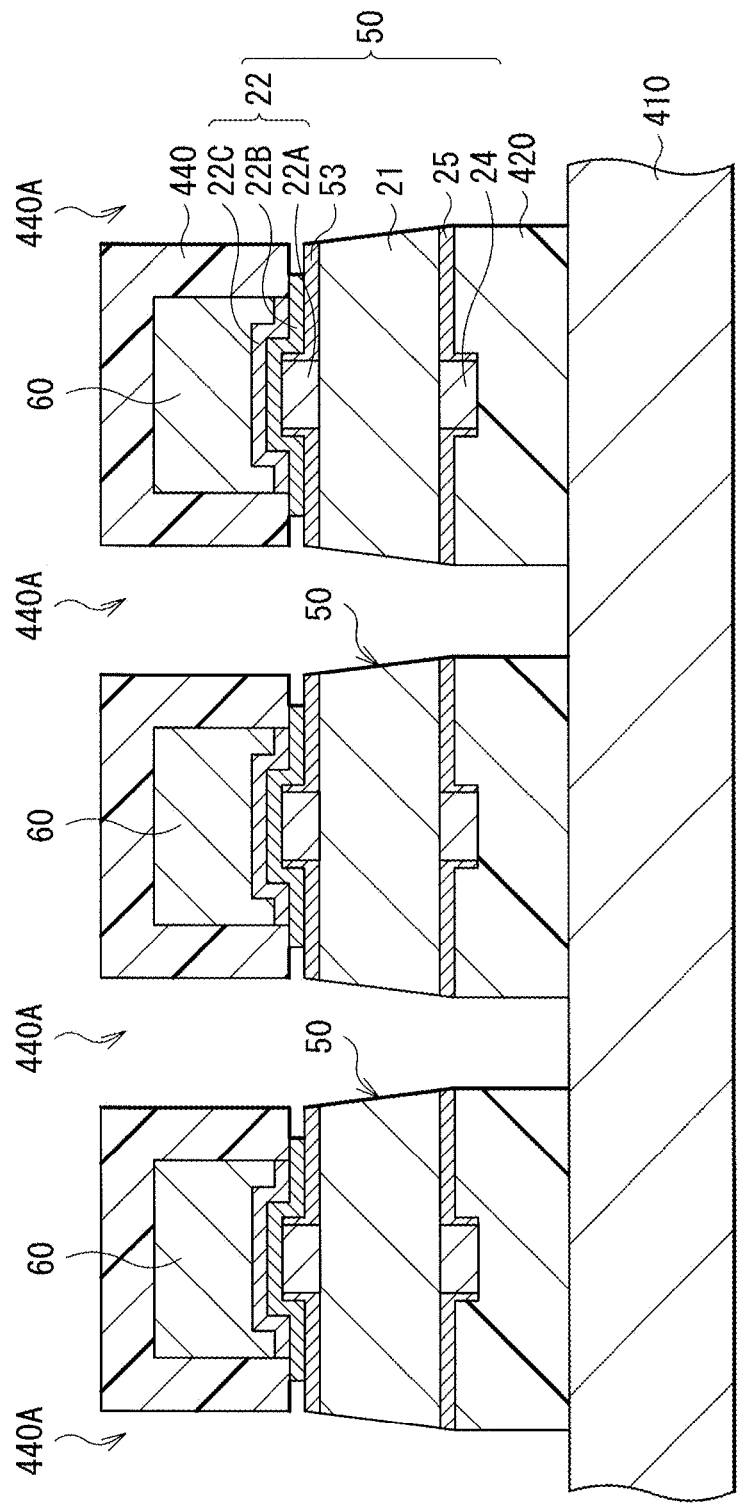
[FIG. 36]

[FIG. 37]
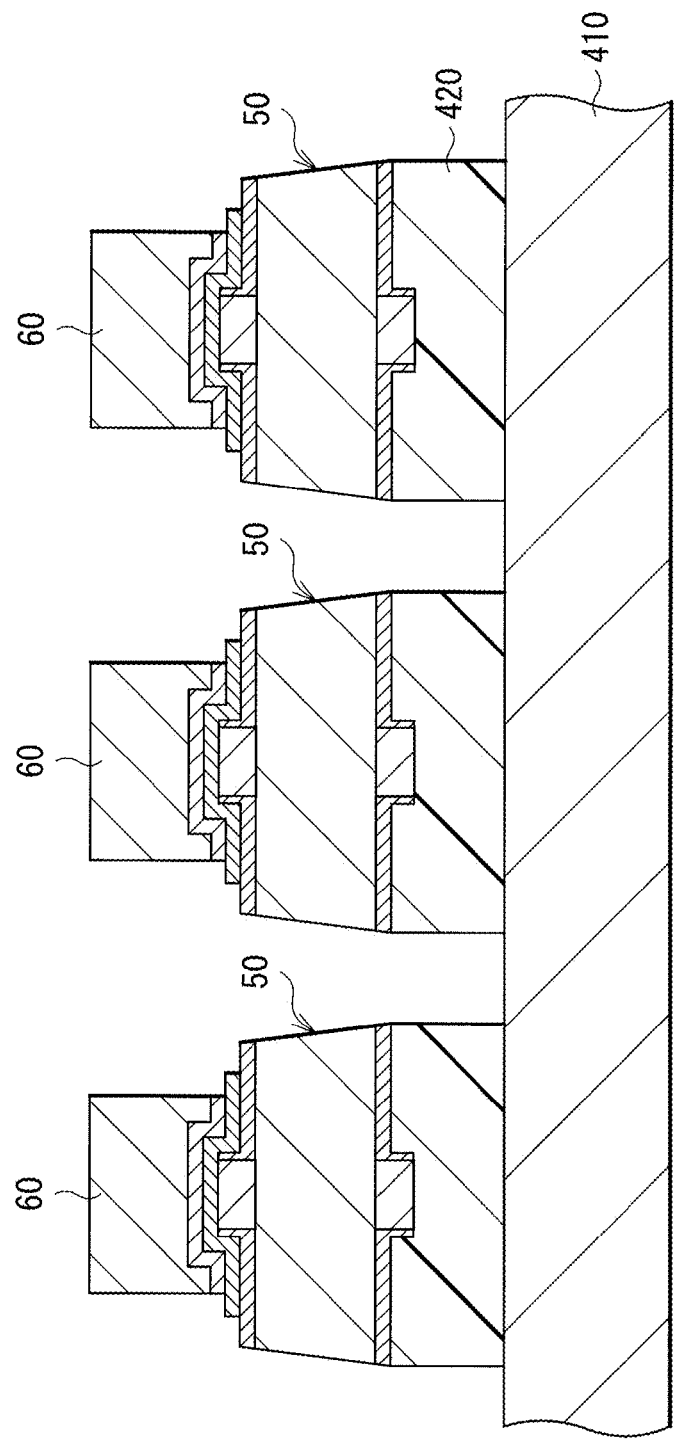

[ FIG. 38 ]
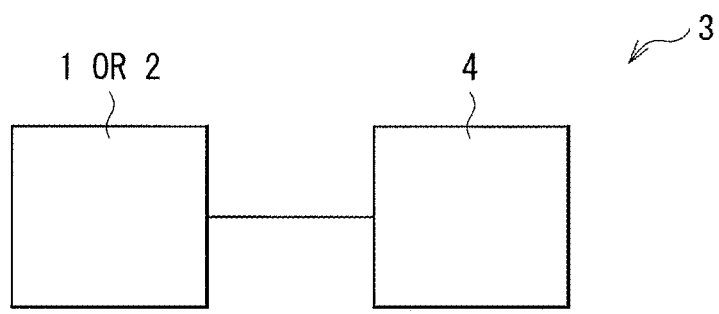

MOUNTING SUBSTRATE AND METHOD OF MANUFACTURING THE SAME

This Application is a national stage filing under 35 U.S.C. 371 of International Patent Application Serial No. PCT/JP 2015/075463, filed Sep. 8, 2015, entitled "MOUNTED BOARD AND METHOD FOR MANUFACTURING SAME", which claims priority under 35 U.S.C. § 119(a)-(d) or 35 U.S.C. § 365(b) to Japanese application number 2014-190952, filed Sep. 19, 2014, the entire contents of which are incorporated herein by reference in their entireties.

TECHNICAL FIELD

The present technology relates to a mounting substrate in which an element is mounted on a wiring substrate, and a method of manufacturing the same.

BACKGROUND ART

In element mounting on a wiring substrate, specifically in order to mount a large number of fine elements, it is necessary to mount the elements on the wiring substrate with high accuracy. Accordingly, there have been proposed various technologies of element mounting on the wiring substrate (refer to Patent Literature 1).

CITATION LIST

Patent Literature

[Patent Literature 1] Japanese Unexamined Patent Application Publication No. 2013-232667

SUMMARY OF INVENTION

When a large number of fine elements are mounted on a wiring substrate, a small element size or a small gap size between elements may cause various failures.

It is therefore desirable to provide a mounting substrate and a method of manufacturing the same that allow for reduction of failures in mounting of fine elements caused by a small element size or a small gap size.

A method of manufacturing a mounting substrate according to a first embodiment of the present technology includes the following three steps:

(A1) a first step of forming a plurality of electrodes on a semiconductor layer, and thereafter forming one of solder bumps at a position facing each of the electrodes;

(A2) a second step of covering the solder bumps with a coating layer, and thereafter selectively etching the semiconductor layer with use of the coating layer as a mask to separate the semiconductor layer into a plurality of elements; and (A3) a third step of removing the coating layer, and thereafter mounting the elements on a wiring substrate to direct the solder bumps toward the wiring substrate, thereby forming the mounting substrate.

In the method of manufacturing the mounting substrate according to the first embodiment of the present technology, element separation is performed with use of the coating layer covering the solder bumps as a mask. This makes it possible to minimize occasion in which the solder bumps are exposed. Incidentally, in a case in which an element size is small, the solder bumps are also small in size. Accordingly, a bonding failure caused by surface oxidation of the solder bumps easily occurs. However, in the present technology, the occasion in which the solder bumps are exposed is minimized, thereby suppressing the surface oxidation of the solder bump. Accordingly, the bonding failure of the solder bump is suppressed.

A method of manufacturing a mounting substrate according to a second embodiment of the present technology includes the following three steps:

(B1) a first step of forming a plurality of electrodes on a supporting substrate, forming a seed layer on an surface including the respective electrodes, and forming a through groove in a portion of the seed layer, the portion facing a portion between adjacent two of the electrodes;

(B2) a second step of forming, at a position facing each of the electrodes, one of a plurality of solder bumps electrically coupled to the seed layer; and (B3) a third step of separating the seed layer into a plurality of seed sections with use of the through groove, and thereafter mounting each of a plurality of the elements on the supporting substrate with one or more of the solder bumps in between.

In the method of manufacturing the mounting substrate according to the second embodiment of the present technology, before forming the solder bumps, the through groove is formed in the portion, which faces the portion between adjacent two of the electrodes, of the seed layer. Incidentally, in a case in which the above-described through groove is formed in the seed layer after formation of the solder bumps, for example, it is necessary to coat the respective solder bumps with the coating layer, form a groove having a large aspect ratio in the coating layer, and etch the seed layer through the groove. In a case in which a gap size between the elements is small, a width of the groove is also small; therefore, it is difficult to etch the seed layer. However, in the present technology, the above-described through groove is formed in the seed layer before formation of the solder bumps, which makes it possible to easily etch the seed layer.

A mounting substrate according to an embodiment of the present technology includes: a wiring substrate; a plurality of elements each disposed at a position facing a top surface of the wiring substrate; and a plurality of solder bumps, one or more of the solder bumps being provided between the wiring substrate and each of the elements to electrically couple the wiring substrate and each of the elements to each other. Each of the elements includes: a semiconductor layer, one or more electrodes provided in contact with a portion of a bottom surface of the semiconductor layer, and an insulating layer provided in contact with an entire portion excluding the one or more electrodes of the bottom surface of the semiconductor layer without contacting a side surface of the semiconductor layer.

In the mounting substrate according to the embodiment of the present technology, the insulating layer is provided in contact with the entire portion excluding the one or more electrodes of the bottom surface of the semiconductor layer without contacting the side surface of the semiconductor layer. For example, it is assumed here that composite elements configured of the elements and the solder bumps are mounted on the wiring substrate coated with a flux to direct the solder bumps toward the wiring substrate, thereby manufacturing the mounting substrate of the present technology. In this case, for example, a stacking body configured of the semiconductor layer, the insulating layer, and the seed layer is selectively etched with use of, for example, the coating layer covering the solder bumps as a mask until penetrating through the stacking body, which makes it possible to form the respective elements. In a case in which the respective elements are formed in such a manner, misalignment between cores of the solder bumps and cores of the elements is reduced, as compared with a case in which the semiconductor layer, the insulating layer, and the seed section are selectively etched with different masks. In a case in which misalignment between the cores of the solder bumps and the cores of the elements is large, accuracy in mounting position easily deteriorates. In particular, in a case in which the size of the element is small, in addition to great deterioration in the accuracy in mounting position, the elements are more likely to be mounted in an inclined state. However, in the present technology, since the misalignment between the cores of the solder bumps and the cores of the elements is small, the accuracy in mounting position is extremely high, and a possibility that the element is mounted in an inclined state is extremely low.

According to the method of manufacturing of the first embodiment of the present technology, it is possible to suppress the bonding failure caused by the surface oxidation of the solder bump even if the element size is small, which makes it possible to suppress failures caused by a small element size. It is to be noted that effects described here are non-limiting, and may be one or more of effects described in the present technology.

According to the method of manufacturing the mounting substrate of the second embodiment of the present technology, it is possible to easily etch the seed layer even if a gap size between the elements is small, which make it possible to suppress failures caused by the small gap size between the elements. It is to be noted that effects described here are non-limiting, and may be one or more of effects described in the present technology.

According to the mounting substrate of the embodiment of the present technology, it is possible to reduce deterioration in accuracy in mounting position and the possibility that the elements are mounted in the inclined state even if the element size is small, which makes it possible to suppress failures caused by the small element size. It is to be noted that effects described here are non-limiting, and may be one or more of effects described in the present technology.

BRIEF DESCRIPTION OF DRAWINGS

FIG. 1 is a diagram illustrating an example of a top configuration of a mounting substrate according to a first embodiment of the present technology.

FIG. 2 is a diagram illustrating an example of a cross-sectional configuration taken along a line A-A of the mounting substrate in FIG. 1.

FIG. 3 is a diagram illustrating an example of a cross-sectional configuration taken along a line B-B of the mounting substrate in FIG. 1.

FIG. 4 is a flow chart illustrating an example of a procedure of manufacturing the mounting substrate in FIG. 1.

FIG. 5 is a cross-sectional view of an example of a configuration of a wiring substrate.

FIG. 6 is a cross-sectional view of a process following FIG. 5.

FIG. 7 is a cross-sectional view of a process following FIG. 6.

FIG. 8A is a cross-sectional view of a process following FIG. 7.

FIG. 8B is a diagram illustrating an example of a planar configuration of FIG. 8A.

FIG. 9 is a cross-sectional view of a process following FIG. 8A.

FIG. 10 is a cross-sectional view of a process following FIG. 9.

FIG. 11A is a cross-sectional view of a process following FIG. 10.

FIG. 11B is a diagram illustrating an example of a planar configuration of FIG. 8A.

FIG. 12 is a cross-sectional view of a process following FIG. 11A.

FIG. 13 is a cross-sectional view of a process following FIG. 12.

FIG. 14 is a diagram illustrating an example of temperatures during drying, during pre-heating, and during reflow.

FIG. 15 is a cross-sectional view of a process following FIG. 13.

FIG. 16 is a cross-sectional view of a process following FIG. 15.

FIG. 17 is a cross-sectional view of a process following FIG. 16.

FIG. 18 is a cross-sectional view of a process following FIG. 17.

FIG. 19 is a diagram illustrating an example of a top configuration of a mounting substrate according to a second embodiment of the present technology.

FIG. 20 is a diagram illustrating an example of a cross-sectional configuration taken along a line A-A of the mounting substrate in FIG. 19.

FIG. 21 is a diagram illustrating an example of a cross-sectional configuration taken along a line B-B of the mounting substrate in FIG. 19.

FIG. 22 is a flow chart illustrating an example of a process of manufacturing the mounting substrate in FIG. 19.

FIG. 23 is a cross-sectional view of an example of a configuration of a wiring substrate.

FIG. 24 is a cross-sectional view of a process following FIG. 23.

FIG. 25 is a cross-sectional view of a process following FIG. 24.

FIG. 26 is a cross-sectional view of a process following FIG. 25.

FIG. 27 is a cross-sectional view of a process following FIG. 26.

FIG. 28 is a cross-sectional view of a process following FIG. 27.

FIG. 29 is a flow chart illustrating an example of a procedure of manufacturing composite elements configured of elements and solder bumps.

FIG. 30 is a cross-sectional view of an example of a configuration of an element substrate.

FIG. 31 is a cross-sectional view of a process following FIG. 30.

FIG. 32 is a cross-sectional view of a process following FIG. 31.

FIG. 33 is a cross-sectional view of a process following FIG. 32.

FIG. 34 is a cross-sectional view of a process following FIG. 33.

FIG. 35 is a cross-sectional view of a process following FIG. 34.

FIG. 36 is a cross-sectional view of a process following FIG. 35.

FIG. 37 is a cross-sectional view of a process following FIG. 36.

FIG. 38 is a diagram illustrating an example of a schematic configuration of an electronic apparatus according to a third embodiment of the present technology.

MODES FOR CARRYING OUT THE
INVENTION

In the following, some embodiments of the present technology are described in detail with reference to the drawings. It is to be noted that description is given in the following order.
1. First Embodiment (Mounting Substrate)
Example in which a seed layer between electrodes is removed before formation of a bump
Example in which mounting is performed after bumps are provided on a wiring substrate
2. Second Embodiment (Mounting Substrate)
Example in which element separation is performed using, as a mask, a photoresist covering bumps
Example in which mounting is performed after bumps are provided on elements
3. Common Modification Examples for Respective Embodiments (Mounting Substrate)
4. Third Embodiment (Electronic Apparatus)
Example in which the mounting substrate according to any of the above-described embodiments is mounted in an electronic apparatus
1. <First Embodiment>
[Configuration]
First, description is given of a mounting substrate 1 according to a first embodiment of the present technology. FIG. 1 illustrates an example of a top configuration of the mounting substrate 1. FIG. 2 illustrates an example of a cross-sectional configuration taken along a line A-A of the mounting substrate 1. FIG. 3 illustrates an example of a cross-sectional configuration taken along a line B-B of the mounting substrate 1. The mounting substrate 1 includes a wiring substrate 10, a plurality of elements 20, and a plurality of solder bumps 30. In the mounting substrate 1, the elements 20 on the wiring substrate 10 may be mounted with the solder bumps 30 in between. The wiring substrate 10 is electrically coupled to the respective elements 20 through the solder bumps 30.

(Wiring Substrate 10)

The wiring substrate 10 may include a supporting substrate 11, a plurality of electrode pads 12, a plurality of electrode pads 13, an insulating layer 14, and a plurality of wirings 15. For example, one of the electrode pads 12, one of the electrode pads 13, and one of the wirings 15 may be assigned to each of the elements 20.

The supporting substrate 11 may support the plurality of elements 20. The supporting substrate 11 may be configured of, for example, a silicon substrate, a glass substrate, a quartz substrate, or a resin substrate.

The electrode pads 12 may be formed in contact with the supporting substrate 11, for example. The electrode pads 12 may be disposed directly below the solder bumps 30, and may be in contact with the solder bumps 30. The electrode pads 12 may be electrically coupled to electrodes 22 (to be described later) of the elements 20 through the solder bumps 30. The plurality of electrode pads 12 may be disposed with the same arrangement pitch as an arrangement pitch of the elements 20.

The electrode pads 12 may each be configured of an electrode 12A, a seed section 12B, and a barrier section 12C that are stacked in this order on the supporting substrate 11. The electrode 12A may be formed in contact with the supporting substrate 11, and may be disposed at a position facing the solder bump 30. The electrode 12A may be disposed at a position facing an aperture 14A (to be described later) of the insulating layer 14. A top surface of the electrode 12A may be exposed in the aperture 14A. The electrode 12A may be made of, for example, a wiring material such as copper and aluminum. For example, the seed section 12B may be formed in contact with a portion of a top surface of the insulating layer 14 including the top surface of the electrode 12A. The seed section 12B may function as an electrode layer during electrolytic plating. The seed section 12B may be configured of, for example, titanium and copper that are stacked in this order. A gap between adjacent two of the seed sections 12B may be narrower than, for example, a size of the solder bump 30 (for example, a diameter of about 15 μm), and may be, for example, about 2 μm. The barrier section 12C may be formed in contact with the seed section 12B, and may be disposed at a position facing the solder bump 30. The barrier section 12C may be a UBM (under bump metal) serving as a base of the solder bump 30, for example. The UBM may be made of, for example, Ni, and may function as a solder diffusion suppressing layer.

The electrode pads 13 may be formed in contact with the supporting substrate 11, for example, as with the electrode pads 12. The electrode pads 13 may each be disposed at a position facing an aperture 14B (to be described later) of the insulating layer 14. A top surface of each of the electrode pads 13 may be exposed in the aperture 14B. The electrode pads 13 may be disposed at positions different from positions directly below the solder bumps 30, and may be electrically coupled to electrodes 24 (to be described later) of the elements 20 through the wirings 15. The electrode pads 13 may be made of, for example, a wiring material such as copper and aluminum.

The insulating layer 14 may have the apertures 14A at positions facing the respective electrode pads 12, and may have the apertures 14B at positions facing the respective electrode pads 13. The electrodes 12A may be disposed at positions facing the respective apertures 14A. The electrode pads 13 may be disposed at positions facing the aperture 14B. It is only necessary for the insulating layer 14 to have electrical characteristics and reliability that are necessary as the mounting substrate 1 and withstand a solder reflow temperature. The insulating layer 14 may be made of, for example, a glass epoxy, a solder resist, polyimide, silicon dioxide, or silicon nitride.

The wirings 15 may each electrically couple the electrode pad 13 and the electrode 24 to each other. The wirings 15 may be made of, for example, a wiring material such as copper and aluminum. The wirings 15 may be disposed in midair without contacting side surfaces of the elements 20. It is to be noted that the mounting substrate 1 may include an embedding layer that embeds, for example, the respective elements 20 and the wirings 15.

(Element 20)

The plurality of elements 20 may be disposed at positions facing a top surface of the wiring substrate 10. The elements 20 may be transferred from an element substrate onto the wiring substrate 10 with the solder bumps 30 in between, for example. Alternatively, the elements 20 may be disposed on the solder bumps 30 by a method other than transferring (for example, a mounter). The elements 20 may be disposed separately from one another in a plane. The elements 20 may each be a chip of a submillimeter size, for example. The elements 20 may each be an individual component serving as a constituent element of, for example, an apparatus and an electronic circuit, and may be a chip-like component. The elements 20 may each be, for example, a light-emitting element (such as a LED (light-emitting diode), a LD (laser diode), and an organic EL element), a light-receiving element (such as a PD (photodiode)), or a circuit element (such as a capacitor, a transistor, a resistor, an IC (integrated circuit), and an LSI (large-scale integration)). Moreover, the elements 20 may each include two or more of the light-emitting element, the light-receiving element, and the circuit element mentioned above.

The elements 20 may each include, for example, a semiconductor layer 21, the electrode 22 and an insulating layer 23 that are disposed on a bottom surface of the semiconductor layer 21, and the electrode 24 and an insulating layer 25 that are disposed on a top surface of the semiconductor layer 21, as illustrated in FIG. 2. Alternatively, the elements 20 may each include the electrode 22 and the electrode 24 on the bottom surface of the semiconductor layer 24. Alternatively, the elements 20 may each include a plurality of electrodes 22 on the bottom surface of the semiconductor layer 21. The following description is given of a case in which the elements 20 each include one electrode 22 and one electrode 24 on the bottom surface and the top surface of the semiconductor layer 21, respectively.

The semiconductor layer 21 may be a section having a function of the element 20 exemplified above, and may include, for example, an LED, an LD, an organic EL element, an PD, a capacitor, a transistor, a resistor, an IC, or an LSI.

The electrode 22 may be disposed in contact with a portion of the bottom surface of the semiconductor layer 21. The electrode 22 may cause the semiconductor layer 21 and the solder bump 30 to be electrically coupled to each other. It is to be noted that in a case in which each of the elements 20 includes a plurality of electrodes 22, some of the electrodes 22 may be dummies that do not help the function of the semiconductor layer 21. In this case, a portion configured of the dummy electrode 22 and the solder bump 30 disposed on the dummy electrode 22 may function as a protrusion made of a metal. The protrusion may secure stability of the element 20.

The electrode 22 may be configured of, for example, an electrode 22A, a seed section 22B, and a barrier section 22C that are stacked in this order from the semiconductor layer 21 side. The electrode 22A may be provided in contact with a portion of the bottom surface of the semiconductor layer 21, and may be disposed at a position facing an aperture of the insulating layer 23. The seed section 22B may function as an electrode layer during electrolytic plating. The seed section 22B may be configured of, for example, titanium and copper that are stacked in this order. The seed section 22B may be provided in contact with the electrode 22A and the insulating layer 23. The seed section 22B may be electrically coupled to the electrode 22A, the barrier section 22C, and the solder bump 30. The barrier section 22C may be an UBM (under bump metal), for example.

The insulating layer 23 may have an aperture at a position facing the electrode 22A. The electrode 22A may be exposed in the aperture of the insulating layer 23. The insulating layer 23 may be provided in contact with an entire portion not in contact with the electrode 22A of the bottom surface of the semiconductor layer 21 and in contact with a side surface of the semiconductor layer 21. The insulating layer 23 may be made of, for example, silicon dioxide or silicon nitride.

The electrode 24 may cause the semiconductor layer 21 and the electrode 15 to be electrically coupled to each other. The electrode 24 may be provided in contact with a portion of the top surface of the semiconductor layer 21 and may be disposed at a position facing an aperture of the insulating layer 25. The insulating layer 25 may have the aperture at a position facing the electrode 24. The insulating layer 25 may be made of, for example, silicon oxide or silicon nitride.

(Solder Bump 30)

One or more of the plurality of solder bumps 30 may be provided between the wiring substrate 10 and each of the elements 20. More specifically, one of the solder bumps 30 may be provided at a position facing each of the electrodes 22. The solder bump 30 may cause the wiring substrate 10 and the element 20 to be electrically coupled to each other. It is to be noted that in a case in which some of the electrodes 22 in each of the elements 20 are dummies, the solder bumps 30 in contact with the dummy electrodes 22 may each function as a protrusion made of a metal that secures stability of the element 20. A diameter of each of the solder bumps 30 may be, for example, smaller than a size of a so-called microbump, that is, for example, about 15 μm. A height of each of the solder bumps 30 may be preferably a height that does not cause the electrode pad 12 to be directly in contact with the electrode 22 of the element 20, that is, for example, about 5 μm. A gap between adjacent two of the solder bumps 30 may be, for example, narrower than the size of each of the solder bumps 30 (for example, a diameter of about 15 μm), that is, for example, about 10 μm. The solder bumps 30 may be made of, for example, an alloy including tin and silver, and may be formed by, for example, electrolytic plating.

[Manufacturing Method]

Next, description is given of an example of a method of manufacturing the mounting substrate 1.

FIG. 4 illustrates a flow chart of an example of a procedure of manufacturing the mounting substrate 1. FIGS. 5 to 13 and FIGS. 15 to 18 each illustrate a cross-sectional view of an example of a process of manufacturing the mounting substrate 1. FIG. 14 illustrates an example of temperatures during drying, during preheating, and during reflow.

First, the plurality of electrodes 12A may be formed on the supporting substrate 11 (step S101, FIG. 5). Next, the insulating layer 14 may be formed on an entire surface including the respective electrodes 12A, and thereafter the aperture 14A may be formed at a position facing to the top surface of each of the electrodes 12A (FIG. 6). Thus, each of the electrodes 12A may be exposed in each of the apertures 14A. Thereafter, a seed layer 12B' may be formed on the entire surface including the respective electrodes 12A by, for example, sputtering (step S102, FIG. 7).

Next, a photoresist layer 110 may be formed on the entire surface, and thereafter, a groove 110A may be formed in a portion, which faces a portion between adjacent two of the electrodes 12A, of the photoresist layer 110 (refer to FIGS. 8A and 8B). The groove 110A may be a through groove penetrating the photoresist layer 110. Next, the seed layer 12B' may be selectively etched using the photoresist layer 110 as a mask. More specifically, a portion, which faces the portion between adjacent two of the electrodes 12A, of the seed layer 12B' may be etched. Thus, a through groove 12-1 penetrating the seed layer 12B' may be formed in the portion, which faces the portion between adjacent two of the electrodes 12A, of the seed layer 12B' (step S103, FIGS. 8A and 8B). For example, a hydrogen peroxide-phosphoric acid-based water solution may be used as an etchant for the portion where the seed layer 12B' is made of copper. For example, a fluorine-based compound may be used as an etchant for a portion where the seed layer 12B' is made of titanium.

Next, after the photoresist layer 110 is removed, a photoresist layer 120 may be formed on the entire surface, and an aperture 120A may be formed in a portion facing each of the electrodes 12A of the photoresist layer 120 (FIG. 9). Next, the barrier sections 12C and the solder bumps 30 may be formed with use of, for example, an electrolytic plating method. More specifically, each of the barrier sections 12C and each of the solder bumps 30 may be formed in this order on the seed layer 12B' exposed in each of the apertures 120A with use of the electrolytic plating method (step S103, FIG. 10). Thus, one of the plurality of barrier sections 12C and one of the plurality of solder bumps 30 that are electrically coupled to the seed layer 12B' may be formed at a position facing each of the electrodes 12A. Moreover, the respective solder bumps 30 may be formed with use of the electrolytic plating method to cause top surfaces of the respective solder bumps 30 to become flat surfaces 30A. The respective flat surfaces 30A may each have a role as a mounting surface in a later process.

Incidentally, in a case in which the plurality of solder bumps 30 are formed with use of the electrolytic plating method, in addition to forming the solder bumps 30, the solder bumps 30 may be preferably lifted up from a plating bath in an energized state. In other words, energization may preferably continue even at the end of plating. Thereafter, the photoresist layer 120 may be removed. Thus, the wiring substrate 10 may be formed, and the solder bumps 30 may be formed on the wiring substrate 10. Subsequently, in order to prevent progress of oxidation on the surfaces of the respective solder bumps 30 a photoresist layer 150 may be applied onto an entire surface including the respective solder bumps 30 until execution of a process of applying a flux 130 to be described later (refer to FIG. 11A). At this occasion, the seed layer 12B' may be further etched selectively with use of the photoresist layer 150 as a mask to communicate the through grooves 12-1 with one another, thereby separating the seed layer 12B' into the plurality of seed sections 12B. For example, first, a groove 150A may be formed in a portion including portions facing ends of the through grooves 12-1 of the photoresist layer 150 (refer to FIG. 11B). The groove 150A may have a lattice shape surrounding a portion facing the electrodes 12A, for example. Next, the seed layer 12B' may be selectively etched through the groove 150A. Thus, the seed layer 12B' may be separated into the plurality of seed sections 12B with use of the respective through grooves 12-1. At this occasion, one of the seed sections 12B may be provided at a position facing each of the electrodes 12A.

Next, after the photoresist layer 150 is removed, the flux 130 may be applied onto the entire surface including the respective solder bumps 30 (FIG. 12). The flux 130 may have a role in holding the elements 20 and improving solder wettability.

In a case in which the solder bump 30 is smaller in size than a microbump and the number of solder bumps 30 assigned to one element 20 is two or less, it is extremely difficult for the element 20 to maintain a self-standing state in a period from mounting the element 20 on the solder bump 30 until executing reflow. Accordingly, giving high viscosity to the flux 130 secures self-standing of the element 20 by the flux 130, thereby preventing displacement of the element 20. Herein, appropriate viscosity of the flux 130 may be within a range of about 50 Pa·s to 1000 Pa·s both inclusive. The appropriate viscosity may be selected by the shape and size of the element 20, the state of the solder bump 30, and any other factor. There are some methods of applying the flux 130 such as spin coating, spraying, a doctor blade, a slit coater, and a flux sheet. The flux 130 may be applied by any of the methods mentioned above.

Next, each of the plurality of elements 20 may be mounted on the wiring substrate 10 with one or more of the solder bumps 30 in between in a state where the flux 130 is applied (step S105, FIG. 13). For example, the plurality of elements 20 may be transferred onto the wiring substrate 10 with the solder bumps 30 in between. Alternatively, the elements 20 may be mounted on the solder bumps 30 by a method other than transferring. Next, drying is performed, and thereafter, preheating and reflow are performed (step S106). Heating processes including drying, preheating and reflow may be performed in a reflow furnace. Alternatively, drying may be performed outside the reflow furnace, and the preheating and the reflow may be performed in the reflow furnace. It may not be necessary to perform the preheating on the wiring substrate 10 immediately after performing the drying. The wiring substrate 10 subjected to the drying may be stored in a predetermined storage place, and thereafter may be subjected to the preheating. The preheating and the reflow may be preferably performed successively in the reflow furnace. It is to be noted that the drying may be omitted in a case in which performing the preheating and the reflow without performing drying does not cause an issue.

FIG. 14 illustrates an example of temperatures during the drying, during the preheating, and during the reflow, as described above. After performing mounting, a drying period $\Delta t3$, a preheating period $\Delta t4$, and a reflow period $\Delta t5$ are gone through in this order. The drying period $\Delta t3$ may be a period in which after performing mounting, the flux 130 is heated at a temperature lower than a softening point T1 of the flux 130 to volatilize a solvent contained in the flux 130 (a period in which the flux 130 is dried). The drying period $\Delta t3$ corresponds to a portion in a flux solid phase period $\Delta t1$. The preheating period $\Delta t4$ may be a period in which the flux 130 is heated at a temperature higher than the softening point T1 of the flux 130 and lower than a melting point (a solder melting point T2) of the solder bump 30 to activate the flux 130 and volatilize, for example, a rosin contained in the flux 130. A liquid level of the flux 130 is decreased by volatilizing, for example, the rosin contained in the flux 130. The reflow period $\Delta 5$ may be a period in which reflow is performed. The preheating period $\Delta t4$ and the reflow period $\Delta t5$ correspond to portions in a flux liquid phase period $\Delta t2$. Accordingly, after performing mounting, the flux 130 may be heated at a temperature lower than the softening point T1 of the flux 130 to be dried, and thereafter the flux 130 may be heated at a temperature higher than the softening point T1 of the flux 130 and lower than the melting point (solder melting point T2) of the solder bump 30 to activate the flux 130 and decrease the liquid level of the flux 130. Thereafter, the reflow may be performed.

In the present embodiment, the elements 20 may be fixed by providing the drying period $\Delta t3$ and gently volatilizing the solvent, for example, at a temperature lower than the softening point T1 of the flux 130 to dry the flux 130.

There is a possibility that the elements 20 move during the drying depending on composition of the flux 130. In a case in which a solvent having high viscosity and low volatility is used for the pursuit of viscosity, when the flux 130 is forced to be volatilized, the flux 130 may cause convection, which results in movement of the elements 20. Accordingly, it is necessary to sufficiently consider selection of the solvent, and it is important to appropriately set a drying temperature of the flux 130, a vapor pressure of the solvent of the flux 130, a solid ratio of the flux 130, and any other factor. In particular, in a case in which after the flux 130 with low viscosity is applied by, for example, rotation coating or spraying, the viscosity of the flux 130 is increased to suitable viscosity for holding the elements 20 and the flux 130 is dried after mounting, it may be effective to mix the flux 130 with a solvent that is immediately volatilized without causing convection at a temperature or a pressure in each step. The solvent of the flux 130 is not specified in particular; however, a high-volatile solvent such as an IPA or a thinner may not be preferable, since such a solvent may change in viscosity or be dried in a stage in which the elements 20 are mounted. A combination of a plurality of solvents having gentle volatility at room temperature and having vapor pressures that are different and gentle at a low temperature of 50° C. to 100° C. both inclusive may be preferably used. Drying conditions in the drying period Δt3 may be determined by a relationship between the flux 130 and the solvent, and the elements 20 to be mounted.

Moreover, in the present embodiment, after completion of the drying period Δt3, the preheating and the reflow are performed in this order.

The elements 20 and the supporting substrate 10 may be bonded together with the solder bumps 30 in between by the reflow process. A reflow temperature profile may be set appropriately depending on a solder to be used. It is necessary for a preheating profile to match properties of the flux 130. First, in a typical flux, an effect of activity is exhibited after a rosin is softened. Accordingly, it is necessary for a lower limit of the preheating temperature to exceed a softening point of the rosin. In contrast, the flux 130 having held the elements 20 may be softened or vaporized by heating; however, when the softening point of the rosin is high, the flux 130 is not volatilized and repeats convection during reflow without exhibiting the effect as a viscous liquid having high viscosity. When the temperature reaches the solder melting point T2 in such a state, the flux 130 may cause deterioration in element bondability. This may cause mounting failures such as bonding failure, element displacement, and element inclination. In order to prevent this, the flux 130 may be preferably reduced (volatilized) to a volume at which the flux 130 slightly covers a bonding surface 30B between the solder bump 30 and the electrode 22 until reaching the solder melting point T2. However, in the reflow period, it is necessary for the liquid level of the flux 130 to be located at a position higher than the bonding surface 30B between the solder bump 30 and the element 20 (FIG. 15). Accordingly, an upper limit of the preheating temperature may be determined by the kind (softening point) of the rosin and an amount of reduction of the rosin. Preheating time may be preferably set to time at which the volume of the rosin (the flux 130) reaches an appropriate volume.

Thus, the flux 130 may preferably have viscosity that does not cause each of the elements 20 to deviate from the solder bump 30 (a bonding region) until completion of the reflow. Further, the flux 130 may preferably have volatility at which the liquid level 130A of the flux 130 decreases within a range in which a self-alignment effect is obtained during the reflow.

Finally, the flux 130 may be removed (FIG. 16). Thereafter, a photoresist layer 140 may be formed to cover each of the elements 20 in a dome-like fashion (FIG. 17). At this occasion, an aperture 140A may be provided in a portion facing the electrode 24 of the photoresist layer 140. Next, the wiring 15 may be provided on the surfaces of the electrode pad 13, the photoresist layer 140, and the electrode 24 exposed in the aperture 140A (FIG. 18). An embedding layer that embeds the respective elements 20 may be provided as necessary. Thus, the mounting substrate 1 may be formed.

Effects

Next, description is given of effects of the method of manufacturing the mounting substrate 1.

In etching of seed metal in related art, in many cases, after formation of the solder bump, the seed metal is selectively removed using a chemical agent with use of the solder bump as a mask. However, the seed metal is formed on the entire surface, and many portions of the seed metal are supposed to be removed. Accordingly, while the seed metal is selectively etched, a portion directly below the solder bump of the seed metal is greatly removed, and side etching proceeds. In a case in which the solder bump has a large size, side etching does not affect reliability in strength; however, in a case in which the size of the solder bump is, for example, less than 30 μm, the side etching causes difficulty in maintaining necessary strength.

Hence, for example, the solder bump is covered with, for example, a photoresist and etching is performed with use of the solder bump as a mask. This makes it possible to prevent side etching directly below the solder bump. However, for example, in a case in which a gap between the solder bumps is as narrow as, for example, less than about 30 μm, it may be extremely difficult to form a pattern covering the solder bumps, and an etching liquid may not be sufficiently spread. This may cause an issue that a portion that is supposed to be removed of the seed metal is not removed completely.

In contrast, in the present embodiment, before formation of the solder bumps 30, the through grooves 12-1 each are formed in the portion, which faces the portion between adjacent two of the electrodes 12A, of the seed layer 12B'. This makes it possible to easily perform etching on the seed layer 12B' even though a gap size between the elements 20 is small. As a result, it is possible to prevent failures caused by a small gap size between the elements 20.

Moreover, plating growth of noble metal such as silver is performed without performing energization. Therefore, in a case in which the solder bumps 30 are lifted up from the plating bath after energization is completed, silver is preferentially deposited on the surfaces of the solder bumps 30, and the surfaces of the solder bumps 30 each have a silver-rich composition. In a case in which the volume of the solder bump is large, a proportion of a surface portion in the solder bump is small, and an influence of change in composition of the surface portion is negligible. However, when the volume of the solder bump is equal to or smaller than about a volume of a microbump, the influence of change in composition of the surface portion is not negligible, and the change in composition of the surface portion pronouncedly affects the reflow temperature of the solder bump.

However, in the present embodiment, in a case in which the plurality of solder bumps 30 are lifted up from the plating bath in an energized state upon formation of the solder bumps 30 (that is, in a case in which energization continues even at the end of plating), it is possible to finish plating in a state in which a metal composition ratio in the surface of the solder bump 30 is not different from a metal composition ratio inside the solder bump 30. This makes it possible to reduce a possibility that a reflow failure occurs. Moreover, in the present embodiment, in a case in which the respective solder bumps 30 are formed with use of the electrolytic plating method, the top surface of each of the solder bumps 30 serves as the flat surface 30A. Thus, since a mounting surface of the element 20 is the flat surface 30A, it is possible to reduce a possibility that the element 20 is inclined on the top surface of the solder bump 30, as compared with a case in which the element 20 is mounted on a solder ball. This makes it possible to reduce a possibility that a reflow failure occurs.

Further, in general solder mounting, the flux 130 is not dried. However, in a case in which the solder bumps 30 having an extremely small size are used as with the present embodiment, when the solder bumps 30 coated with the flux 130 are suddenly put into a solder reflow furnace, rapid volatilization of the solvent may cause movement of the elements 20. Therefore, in the present embodiment, in a case in which the drying period Δt3 is provided, the solvent is gently volatilized at a temperature lower than the softening point T1 of the flux 130 to dry the flux 130, thereby fixing the elements 20. This makes it possible to prevent the elements 20 from moving during the preheating and during the reflow. Accordingly, it is possible to reduce a possibility that a reflow failure occurs. Moreover, in the present embodiment, in a case in which the flux 130 has the above-described viscosity and the above-described volatility, it is possible to decrease the liquid level 130A of the flux 130 to an extent that movement of the elements 20 caused by convection of the flux 130 is suppressed. Thus, it is possible to suppress movement of the elements 20 during the preheating and during the reflow.

2. <Second Embodiment>

[Configuration]

Next, description is given of a mounting substrate 2 according to a second embodiment of the present technology. FIG. 19 illustrates an example of a top configuration of the mounting substrate 2. FIG. 20 illustrates an example of a cross-sectional configuration taken along a line A-A of the mounting substrate 2. FIG. 21 illustrates an example of a cross-sectional configuration taken along a line B-B of the mounting substrate 2. The mounting substrate 2 may include a wiring substrate 40, a plurality of elements 50, and a plurality of solder bumps 60. In the mounting substrate 2, a plurality of composite elements configured of the elements 50 and the solder bumps 60 may be mounted on the wiring substrate 40 so as to direct the solder bumps 60 toward the wiring substrate 40. The wiring substrate 40 and each of the elements 50 may be electrically coupled to each other with one or two of the solder bumps 60.

(Wiring Substrate 40)

The wiring substrate 40 may include a supporting substrate 41, a plurality of electrode pads 42, a plurality of electrode pads 43, an insulating layer 44, and a plurality of wirings 45. For example, one of the electrode pads 42, one of the electrode pads 43, and one of the wirings 45 may be assigned to each of the elements 50.

The supporting substrate 14 may support the plurality of elements 40. The supporting substrate 41 may be configured of, for example, a silicon substrate, a glass substrate, a quartz substrate, or a resin substrate.

The electrode pads 42 may be formed in contact with the supporting substrate 41, for example. The electrode pads 42 may be disposed directly below the solder bumps 60, and may be in contact with the solder bumps 60. The electrode pads 42 may be electrically coupled to electrodes 22 of the elements 50 through the solder bumps 60. The plurality of electrode pads 42 may be disposed with the same arrangement pitch as an arrangement pitch of the elements 50. A gap between adjacent two of the electrode pads 42 may be substantially equal to or narrower than, for example, a size of the solder bump 60 (for example, a diameter of about 15 μm).

The electrode pads 42 may each be configured of an electrode 42A, a barrier section 42B, and a plating section 42C that are stacked in this order on the supporting substrate 41. The electrode 42A may be formed in contact with the supporting substrate 41, and may be disposed at a position facing the solder bump 40. The electrode 42A may be disposed at a position facing an aperture 44A (to be described later) of the insulating layer 44. A top surface of the electrode 42A may be exposed in the aperture 44A. The electrode 42A may be made of, for example, a wiring material such as copper and aluminum. The barrier section 42B may be formed in contact with a portion of a top surface of the electrode 42A. The barrier section 42B may be a UBM (under bump metal) serving as a base of the solder bump 60, for example. The UBM may be made of, for example, Ni, and may function as a solder diffusion suppressing layer. The plating section 42C may be formed in contact with, for example, a top surface of the barrier section 42B. The plating section 42C may be made of, for example, gold.

The electrode pads 43 may be formed in contact with the supporting substrate 41, for example, as with the electrode pads 42. The electrode pads 43 may each be disposed at a position facing an aperture 44B (to be described later) of the insulating layer 44. A top surface of each of the electrode pads 43 may be exposed in the aperture 44B. The electrode pads 43 may be disposed at positions different from positions directly below the solder bumps 60, and may be electrically coupled to the electrodes 24 of the elements 50 through the wirings 45. The electrode pads 43 may be made of, for example, a wiring material such as copper and aluminum.

The insulating layer 44 may have the apertures 44A at positions facing the respective electrode pads 42, and may have the apertures 44B at positions facing the respective electrode pads 43. The electrodes 42A may be disposed at positions facing the respective apertures 44A. The electrode pads 43 may be disposed at positions facing the respective aperture 44B. It is only necessary for the insulating layer 44 to have electrical characteristics and reliability that are necessary as the mounting substrate 2 and withstand a solder reflow temperature. The insulating layer 44 may be made of, for example, a glass epoxy, a solder resist, polyimide, silicon dioxide, or silicon nitride.

The wirings 45 may each electrically couple the electrode pad 43 and the electrode 24 to each other. The wirings 45 may be disposed in midair without contacting the elements 50. It is to be noted that the mounting substrate 2 may include an embedding layer that embeds, for example, the respective elements 50 and the wirings 45.

(Element 50)

The plurality of elements 50 may be disposed at positions facing a top surface of the wiring substrate 40. The elements 50 may each include an insulating layer 53 in place of the insulating layer 23 in the elements 20 of the foregoing embodiment. The insulating layer 53 may have an aperture at a position facing the electrode 22A. The electrode 22A may be exposed in the aperture of the insulating layer 53. The insulating layer 53 may be provided in contact with an entire portion not in contact with the electrode 22A of the bottom surface of the semiconductor layer 21 without contacting the side surface of the semiconductor layer 21. In other words, the side surface of the semiconductor layer 21 and a side surface of the insulating layer 23 may be located in a same plane. The insulating layer 23 may be made of, for example, silicon dioxide or silicon nitride.

In each of the elements 50, the electrode 22 may be configured of, for example, the electrode 22A, the seed section 22B, and the barrier section 22C that are stacked in this order from the semiconductor layer 21 side. The electrode 22A may be provided in contact with a portion of the bottom surface of the semiconductor layer 21, and may be disposed at a position facing the aperture of the insulating layer 53. The seed section 22B may function as an electrode layer during electrolytic plating. The seed section 22B may be configured of, for example, titanium and copper that are stacked in this order. The seed section 22B may be provided in contact with the electrode 22A and a portion excluding an end edge of the insulating layer 53. The seed section 22B may be electrically coupled to the electrode 22A, the barrier section 22C, and the solder bump 60. The barrier section 22C may be, for example, an UBM (under bump metal).

(Solder Bump 60)

One of the plurality of solder bumps 60 may be provided at a position facing each of the electrodes 22. In a case in which one of the electrodes 22 is provided for each of the elements 50, one of the solder bumps 60 may be provided between the wiring substrate 40 and each of the elements 50. In a case in which two or more of the electrodes 22 are provided for each of the elements 50, two or more (the same number as the number of the electrodes 22 provided for each of the elements 50) of the solder bumps 60 may be provided between the wiring substrate 40 and each of the elements 50. It is to be noted that in a case in which two or more of the electrodes 22 are provided for each of the elements 50, when some of the electrodes 22 in each of the elements 50 are the above-described dummies, the solder bumps 60 in contact with the dummy electrodes 22 may each function as a protrusion made of a metal that secures stability of the element 50. A diameter of each of the solder bumps 60 may be, for example, smaller than the size of the so-called microbump, that is, for example, about 15 µm. A height of each of the solder bumps 60 may be preferably a height that does not cause the electrode pad 42 to be directly in contact with the electrode 22 of the element 50, that is, for example, about 5 µm. The solder bumps 60 may be made of, for example, an alloy including tin and silver, and may be formed by, for example, electrolytic plating.

[Manufacturing Method]

Next, description is given of a method of manufacturing the mounting substrate 2.

FIG. 22 illustrates a flow chart of an example of a procedure of manufacturing the mounting substrate 2. FIGS. 23 to 28 each illustrate a cross-sectional view of an example of a process of manufacturing the mounting substrate 2.

First, the plurality of electrodes 42A may be formed on the supporting substrate 41 (refer to FIG. 23). Next, the insulating layer 44 may be formed on an entire surface including the respective electrodes 42A, and thereafter the aperture may be formed at a position facing to the top surface of each of the electrodes 42A (refer to FIG. 23). Thus, each of the electrodes 42A may be exposed in each of the apertures. Thereafter, the barrier section 42B and the plating section 42C may be formed in this order on a top surface of each of the electrodes 42A by, for example, an electrolytic plating method (refer to FIG. 23). Thus, the wiring substrate 40 may be formed.

Next, a flux 210 may be applied onto the entire surface including the respective electrodes 42 (FIG. 23). The flux 210 may have a role in holding the elements 50 and improving solder wettability.

In a case in which the solder bump 60 is smaller in size than a microbump and the number of solder bumps 60 assigned to one element 20 is two or less, it is extremely difficult for the element 50 to maintain a self-standing state in a period from mounting, on the electrode pad 42, the element 50 on which the solder bump 60 is formed until executing reflow. Accordingly, giving high viscosity to the flux 210 secures self-standing of the element 50 by the flux 210, thereby preventing displacement of the element 50.

Herein, appropriate viscosity of the flux 210 may be within a range of about 50 Pa·s to 1000 Pa·s both inclusive. The appropriate viscosity may be selected by the shape and size of the element 50, the state of the solder bump 60, and any other factor. There are some method of applying the flux 210 such as spin coating, spraying, a doctor blade, slit coater, and a flux sheet. The flux 210 may be applied by any of the method mentioned above.

Next, the composite elements configured of the elements 50 and the solder bumps 60 may be mounted on the wiring substrate 40 so as to direct the solder bumps 60 toward the wiring substrate 40 (step S201, FIG. 24). For example, the composite elements configured of the elements 50 and the solder bumps 30 may be transferred onto the wiring substrate 10. Alternatively, the above-described composite elements may be mounted on the wiring substrate 10 by a method other than transferring. Next, as with the foregoing embodiment, drying is performed, and thereafter, preheating and reflow are performed (step S202). It is to be noted that the drying may be omitted in a case in which performing the preheating and the reflow without performing drying does not cause an issue. After mounting is performed, as with the foregoing embodiment, the flux 130 may be heated at a temperature lower than the softening point T1 of the flux 130 to be dried, and thereafter, the flux 130 may be heated at a temperature higher than the softening point T1 of the flux 130 and lower than a melting point (solder melting point T2) of the solder bump 60 to activate the flux 130 and decrease the liquid level of the flux 130. Thereafter, the reflow may be performed.

In the present embodiment, as with the foregoing embodiment, the elements 50 may be fixed by providing the drying period Δt3, and gently volatilizing the solvent, for example, at a temperature lower than the softening point T1 of the flux 210 to dry the flux 210.

There is a possibility that the elements 50 move during the drying depending on composition of the flux 210. In a case in which a solvent having high viscosity and low volatility is used for the pursuit of viscosity, when the flux 210 is forced to be volatilized, the flux 210 may cause convection, which results in movement of the elements 50. Accordingly, it is necessary to sufficiently consider selection of the solvent, and it is important to appropriately set a drying temperature of the flux 210, a vapor pressure of the solvent of the flux 210, a solid ratio of the flux 210, and any other factor. In particular, in a case in which the flux 210 with low viscosity is applied by, for example, rotation coating or spraying, the viscosity of the flux 210 is increased to suitable viscosity for holding the elements 50, and the flux 210 is dried after mounting, it may be effective to mix the flux 210 with a solvent that is immediately volatilized without causing convection at a temperature or a pressure in each step. The solvent of the flux 210 is not specified in particular; however, a high-volatile solvent such as an IPA or a thinner may not be preferable, since such a solvent may change in viscosity or be dried in a stage in which the elements 50 are mounted. A combination of a plurality of solvents having gentle volatility at room temperature and having vapor pressures that are different and gentle at a low temperature of 50° C. to 100° C. both inclusive may be preferably used. Drying conditions in the drying period Δt3 may be determined by a relationship between the flux 210 and the solvent, and the elements 50 to be mounted.

Moreover, in the present embodiment, after completion of the drying period Δt3, the preheating (the preheating period Δt4) and the reflow (the reflow period Δt5) are performed in this order. In the present embodiment, the drying period Δt3 may be a period in which after performing mounting, the flux 210 is heated at a temperature lower than the softening point T1 of the flux 210 to volatilize a solvent contained in the flux 210 (a period in which the flux 210 is dried). In the present embodiment, the preheating period Δt4 may be a period in which the flux 210 is heated at a temperature higher than the softening point T1 of the flux 210 and lower than the melting point (the solder melting point T2) of the solder bump 60 to activate the flux 210 and volatilize, for example, a rosin contained in the flux 210. A liquid level of the flux 210 is decreased by volatilizing, for example, the rosin contained in the flux 210.

The elements 50 and the supporting substrate 40 may be bonded together with the solder bumps 60 in between by the reflow process. A reflow temperature profile may be set appropriately depending on a solder to be used. It is necessary for a preheating profile to match properties of the flux 210. First, in a typical flux, an effect of activity is exhibited after a rosin is softened. Accordingly, it is necessary for a lower limit of the preheating temperature to exceed a softening point of the rosin. In contrast, the flux 130 having held the elements 50 may be softened or vaporized by heating; however, when the softening point of the rosin is high, the flux 210 is not volatilized and repeats convection during reflow as a viscous liquid having high viscosity. When the temperature reaches the solder melting point T2 in such a state, the flux 210 may cause deterioration in bondability of the elements 50. This may cause mounting failures such as bonding failure, element displacement, and element inclination. In order to prevent this, the flux 210 may be preferably reduced (volatilized) to a volume at which the flux 210 slightly covers a bonding surface 60A between the solder bump 60 and the electrode 42 until reaching the solder melting point T2. However, in the reflow period, it may be necessary for the liquid level of the flux 210 to be located at a position higher than the bonding surface 60A between the solder bump 60 and the element 50 (FIG. 25). Accordingly, an upper limit of the preheating temperature may be determined by the kind (softening point) of the rosin and an amount of reduction of the rosin. Preheating time may be preferably set to time at which the volume of the rosin (the flux 210) reaches an appropriate volume.

Thus, the flux 210 may preferably have viscosity that does not cause each of the elements 50 to deviate from the electrode pad 42 (a bonding region) on the wiring substrate 40 until completion of the reflow. Further, the flux 210 may preferably have volatility at which the liquid level 210A of the flux 210 decreases within a range in which a self-alignment effect is obtained during the reflow.

Finally, the flux 210 may be removed (FIG. 26). Thereafter, a photoresist layer 220 may formed to cover each of the element 50 in a dome-like fashion (FIG. 27). At this occasion, an aperture 220A may be provided in a portion facing the electrode 24 of the photoresist layer 220. Next, the wiring 45 may be provided on the surfaces of the electrode pad 43, the photoresist layer 220, and the electrode 24 exposed in the aperture 220A (FIG. 28). An embedding layer that embeds the respective elements 50 may be provided as necessary. Thus, the mounting substrate 2 is formed.

Next, description is given of an example of a method of manufacturing the composite elements configured of the elements 50 and the solder bumps 60.

FIG. 29 illustrates a flow chart of an example of a procedure of manufacturing the composite elements. FIGS. 30 to 37 each illustrate a cross-sectional view of an example of a process of manufacturing the composite elements.

First, an element substrate 300 may be prepared (FIG. 30). The element substrate 300 may include a semiconductor layer 21', and the plurality of electrodes 24 and an insulating layer 25' that are provided on one surface of the semiconductor layer 21'. The semiconductor layer 21' may have the same configuration as that of the semiconductor layer 21 at each of positions facing the electrodes 24. The electrodes 24 may be provided in contact with the one surface of the semiconductor layer 21'. The insulating layer 25' may be provided in contact with the one surface of the semiconductor layer 21', and may have an aperture at a position facing each of the electrodes 24. The insulating layer 25' may be made of the same material as that of the insulating layer 25.

Next, the element substrate 300 may be bonded to a supporting substrate 410 (step S301, refer to FIG. 31). More specifically, the element substrate 300 may be bonded to the supporting substrate 410 with an adhesive layer 420 in between so as to direct the electrode 24 side of the element substrate 300 toward the supporting substrate 410. The adhesive layer 420 may hold the element substrate 300 and a plurality of composite elements obtained by element separation. The adhesive layer 420 may be made of, for example, BCB (benzocyclobutene). Next, the plurality of electrodes 22A may be formed on the element substrate 300 (the semiconductor layer 21') (step S302), and an insulating layer 53' may be formed on the element substrate 300 (FIG. 31). The plurality of electrodes 22A may be provided in contact with the other surface of the semiconductor layer 21', and may be disposed, for example, at positions facing the electrodes 24. The insulating layer 53' may be provided in contact with the other surface of the semiconductor layer 21', and may have an aperture at a position facing each of the electrodes 22A. The insulating layer 53' may be made of the same material as that of the insulating layer 53.

Next, a seed layer 22B' may be formed on an entire surface including the respective electrodes 22A (FIG. 32). The seed layer 22B' may function as an electrode layer during electrolytic plating. The seed layer 22B' may be made of the same material as that of the seed section 22. Next, a photoresist layer 430 may be formed on the entire surface, and thereafter apertures 430A may be formed at positions facing the electrodes 22A (FIG. 33). Next, the barrier section 22C and the solder bump 60 may be formed in this order at a position exposed in each of the apertures 430A of the seed layer 22B' by, for example, an electrolytic plating method (step S303, FIG. 34). In other words, one of the solder bumps 60 may be formed at a position facing each of the electrodes 22A with the seed layer 22B' in between. At this occasion, each of the solder bumps 60 may be electrically coupled to the seed layer 22B'. Moreover, top surfaces of the respective solder bumps 60 may serve as flat surfaces 60B by forming the solder bumps 60 by the electrolytic plating method. The respective flat surfaces 60B may serve as bonding surfaces 60A where the solder bumps 60 and the electrode pads 42 are bonded together.

Incidentally, in a case in which the plurality of solder bumps 60 are formed with use of the electrolytic plating method, in addition to forming the solder bumps 60, the solder bumps 60 may be preferably lifted up from a plating bath in an energized state. In other words, energization may preferably continue even at the end of plating. Thereafter, the photoresist layer 430 may be removed.

Next, the photoresist layer 440 that covers the respective solder bumps 60 may be formed on an entire surface including the respective solder bumps 60, and thereafter a groove 440A may be formed in a portion, which faces a portion between adjacent two of the solder bumps 60, of the photoresist layer 440 (step S304, FIG. 35). At this occasion, a side surface of each of the solder bumps 60 may be prevented from being exposed from the photoresist layer 440. The groove 440A may have, for example, a lattice shape surrounding a portion facing each of the solder bumps 60 of the photoresist layer 440. Next, the seed layer 22B' may be selectively etched with use of the photoresist layer 440 as a mask. More specifically, a portion, which faces the portion between adjacent two of the solder bumps 60, of the seed layer 22'B may be selectively etched. Thus, the seed layer 22B' may be separated into a plurality of seed sections 22B (refer to FIG. 36). For example, a hydrogen peroxide-phosphoric acid-based water solution may be used as an etchant for the portion where the seed layer 22B' is made of copper. For example, a fluorine-based compound may be used as an etchant for a portion where the seed layer 22B' is made of titanium.

Next, the insulating layer 23', the semiconductor layer 21', the insulating layer 25', and the adhesive layer 420 may be selectively etched with continuous use of the photoresist layer 440 as a mask (step S305). More specifically, portions, which face the portion between adjacent two of the solder bumps 60, of the insulating layer 23', the semiconductor layer 21', the insulating layer 25', and the adhesive layer 420 may be selectively etched. Thus, the semiconductor layer 21' may be separated into the plurality of elements 50 (FIG. 36). Thereafter, the photoresist layer 440 may be removed (step S306, FIG. 37). Thus, the plurality of composite elements made of the elements 50 and the solder bumps 60 may be formed.

Effects

Next, description is given of effects of the method of manufacturing the mounting substrate 2.

In etching of seed metal in related art, in many cases, after formation of the solder bump, the seed metal is selectively removed using a chemical agent with use of the solder bump as a mask. However, the seed metal is formed on the entire surface, and many portions of the seed metal are supposed to be removed. Accordingly, while the seed metal is selectively etched, a portion directly below the solder bump of the seed metal is greatly removed, and side etching proceeds. In a case in which the solder bump has a large size, side etching does not affect reliability in strength; however, in a case in which the size of the solder bump is, for example, less than 30 μm, the side etching causes difficulty in maintaining necessary strength.

Hence, in the present embodiment, each of the solder bumps 60 is covered with the photoresist layer 440, and the seed layer 22B' is selectively etched with use of the photoresist layer 440 as a mask. This makes it possible to prevent side etching from proceeding directly below the solder bumps 60, even if the size of the element 50 is small. This makes it possible to suppress failures caused by the small size of the element 50.

Moreover, in the present embodiment, the semiconductor layer 21' is selectively etched with continuous use of the photoresist layer 440 as a mask. This makes it possible to minimize occasion in which the solder bump 60 is exposed, as compared with a case in which different masks are used for etching of the seed layer 22B' and etching of the semiconductor layer 21'. In a case in which the size of the element 50 is small, the solder bump 60 is small in size. Accordingly, a bonding failure caused by surface oxidation of the solder bump 60 easily occurs. However, in the present embodiment, the occasion in which the solder bump 60 is exposed is minimized, thereby suppressing the bonding failure caused by the surface oxidation of the solder bump 60. This makes it possible to suppress failures caused by the small size of the element 50.

Further, in general solder mounting, the flux 210 is not dried. However, in a case in which extremely small solder bumps 60 are used as with the present embodiment, when the solder bumps 60 coated with the flux 210 are suddenly put into a solder reflow furnace, rapid volatilization of the solvent may cause movement of the elements 50. Therefore, in the present embodiment, the drying period Δt3 is provided, and the solvent is gently volatilized at a temperature lower than the softening point T1 of the flux 210 to dry the flux 210, thereby fixing the elements 50. This makes it possible to prevent the elements 50 from moving during the preheating and during the reflow. Accordingly, it is possible to reduce a possibility that a reflow failure occurs. Moreover, in the present embodiment, in a case in which the flux 210 has the above-described viscosity and the above-described volatility, it is possible to decrease the liquid level 210A of the flux 210 to an extent that movement of the elements 50 caused by convection of the flux 210 is suppressed. Thus, it is possible to suppress movement of the elements 50 during the preheating and during the reflow.

Furthermore, in the present embodiment, in a case in which the plurality of solder bumps 60 are lifted up from the plating bath in an energized state upon formation of solder bumps 60 (that is, in a case in which energization continues even at the end of plating), it is possible to finish plating in a state in which a metal composition ratio in the surface of the solder bump 60 is not different from a metal composition ratio inside the solder bump 60. This makes it possible to reduce a possibility that a reflow failure occurs. Moreover, in the present embodiment, in a case in which the respective solder bumps 60 are formed with use of the electrolytic plating method, the top surface of each of the solder bumps 60 serves as the flat surface 60B. Thus, since each of the flat surfaces 60B serves as the bonding surface 60A where the solder bump 60 and the electrode pad 42 are bonded together, as compared with a case in which solder balls are provided in place of the solder bumps 60, it is possible to reduce a possibility that the elements 50 are inclined. This makes it possible to reduce a possibility that a reflow failure occurs.

Moreover, in the present embodiment, the insulating layer 23 is in contact with the entire portion excluding the electrodes 22A of the bottom surface of the semiconductor layer 21 without contacting the side surface of the semiconductor layer 21. For example, it is assumed here that the composite elements configured of the elements 50 and the solder bumps 60 are mounted on the wiring substrate 40 coated with the flux 210 to direct the solder bumps 60 toward the wiring substrate 40, thereby manufacturing the mounting substrate 2. In this case, for example, a stacking body configured of the semiconductor layer 21', the insulating layer 23', and the seed layer 22B' may be selectively etched with use of, for example, the photoresist layer 440 covering the solder bumps 60 as a mask until penetrating through the stacking body, which makes it possible to form the respective elements 50. In a case in which the respective elements 50 are formed in such a manner, as compared with a case in which the semiconductor layer 21', the insulating layer 23', and the seed layer 22B' are selectively etched with use of different masks, misalignment between cores of the solder bumps 60 and cores of the elements 50 is reduced. In a case in which the misalignment between the cores of the solder bumps 60 and the cores of the elements 50 is large, accuracy in mounting position easily deteriorates, and in particular, in a case in which the size of the element 50 is small, in addition to great deterioration in the accuracy in mounting position, the element 50 is mounted in an inclined state. However, in the present embodiment, since the misalignment between the cores of the solder bumps 60 and the cores of the elements 50 is small, the accuracy in mounting position is extremely high, and a possibility that the elements 30 are mounted in the inclined state is extremely low. This makes it possible to reduce mounting failures even if the size of the element 50 is small. Accordingly, it is possible to suppress failures caused by the small size of the element 50.

<3. Common Modification Example for Respective Embodiments>

In the foregoing embodiments, a case in which each of the fluxes 130 and 210 contains a resin is exemplified; however, the fluxes 130 and 210 may be any other flux.

<4. Third Embodiment>

[Configuration]

Next, description is given of an electronic apparatus 3 according to a third embodiment of the present technology. FIG. 38 illustrates an example of a schematic configuration of the electronic apparatus 3. The electronic apparatus 3 includes one of the mounting substrates 1 and 2 described in the respective embodiments and the modification examples thereof mentioned above, and a controller 4 that is electrically coupled to the one of the mounting substrates 1 and 2. The controller 4 may be a circuit that applies a voltage or a current to the one of the mounting substrates 1 and 2 and receives an output from the one of the mounting substrates 1 and 2. In the electronic apparatus 3, application of a voltage or a current to the one of the mounting substrates 1 and 2 by the controller 4 may cause the one of the mounting substrates 1 and 2 to function as, for example, a light-emitting panel, a display panel, or a light-receiving panel.

[Manufacturing Method]

Next, description is given of an example of a method of manufacturing the electronic apparatus 3 including the one of the mounting substrates 1 and 2. First, the one of the mounting substrates 1 and 2 may be formed by any of the methods described in the respective embodiments and the modification examples thereof mentioned above. Next, the controller 4 may be prepared, and thereafter, the one of the mounting substrates 1 and 2 may be electrically coupled to the controller 4 to form the electronic apparatus 3.

Effects

Next, description is given of effects of the method of manufacturing the electronic apparatus 3.

In the present embodiment, one of the mounting substrates 1 and 2 is formed by one of the methods described in the respective embodiments and the modification examples thereof mentioned above. This makes it possible for the electronic apparatus 3 to use the one of the mounting substrates 1 and 2 that are less likely to cause failures by the small size of the element 20 or 50, a small gap size between the elements 20, or a small gap size between the elements 50, as compared with a mounting substrate formed by an existing method.

Although description has been made by giving the embodiments and the modification examples thereof, the present technology is not limited thereto and may be modified in a variety of ways. It is to be noted that the effects described in this description are illustrative, and effects of the present technology are not limited thereto. The present technology may have any other effects.

Moreover, the present technology may have the following configurations.

(1)

A method of manufacturing a mounting substrate, including:

a first step of forming a plurality of electrodes on a semiconductor layer, and thereafter forming one of solder bumps at a position facing each of the electrodes;

a second step of covering the solder bumps with a coating layer, and thereafter selectively etching the semiconductor layer with use of the coating layer as a mask to separate the semiconductor layer into a plurality of elements; and a third step of removing the coating layer, and thereafter mounting the elements on a wiring substrate to direct the solder bumps toward the wiring substrate, thereby forming the mounting substrate.

(2)

The method of manufacturing the mounting substrate according to claim 1, wherein in the first step, a seed layer is formed on an entire surface including the respective electrodes, and thereafter one of the solder bumps is formed at a position facing each of the electrodes with the seed layer in between, and in the second step, the seed layer and the semiconductor layer are selectively etched with use of the coating layer as a mask to separate the seed layer into a plurality of seed sections and separate the semiconductor layer into the plurality of elements.

(3)

The method of manufacturing the mounting substrate according to (1) or (2), wherein, in the first step, the respective solder bumps are formed with use of an electrolytic plating method to cause top surfaces of the respective solder bumps to become flat surfaces.

(4)

The method of manufacturing the mounting substrate according to (3), wherein, in the first step, the solder bumps are formed with use of the electrolytic plating method, and the solder bumps are lifted up from a plating bath in an energized state.

(5)

The method of manufacturing the mounting substrate according to any one of (1) to (4), wherein, in the third step, after the coating layer is removed, the elements are mounted on the supporting substrate in a state in which a flux is applied onto the wiring substrate, and then, the flux is heated at a temperature lower than a softening point of the flux to be dried, and thereafter is activated at a temperature higher than the softening point of the flux and lower than a melting point of the solder bump, following which reflow is performed.

(6)

The method of manufacturing the mounting substrate according to (5), wherein the flux has viscosity that does not cause each of the elements to deviate from a bonding region on the wiring substrate until completion of the reflow and has volatility at which a liquid level of the flux decreases within a range in which a self-alignment effect is obtained during the reflow.

(7)

The method of manufacturing the mounting substrate according to (6), wherein, in the third step, in a reflow period, the liquid level of the flux is located at a position higher than a bonding surface between the solder bumps and the elements.

(8)

A method of manufacturing a mounting substrate, including:

a first step of forming a plurality of electrodes on a supporting substrate, forming a seed layer on an surface including the respective electrodes, and forming a through groove in a portion of the seed layer, the portion facing a portion between adjacent two of the electrodes;

a second step of forming, at a position facing each of the electrodes, one of a plurality of solder bumps electrically coupled to the seed layer; and a third step of separating the seed layer into a plurality of seed sections with use of the through groove, and thereafter mounting each of a plurality of the elements on the supporting substrate with one or more of the solder bumps in between.

(9)

The method of manufacturing the mounting substrate according to (7), wherein, in the first step, the respective solder bumps are formed with use of an electrolytic plating method to cause top surfaces of the respective solder bumps to become flat surfaces.

(10)

The method of manufacturing the mounting substrate according to (9), wherein, in the second step, the solder bumps are formed with use of the electrolytic plating method, and the solder bumps are lifted up from a plating bath in an energized state.

(11)

The method of manufacturing the mounting substrate according to any one of (8) to (10), wherein, in the third step, the elements are mounted on the supporting substrate with the solder bumps in between in a state in which a flux is applied onto an entire surface including the respective solder bumps, and then the flux is heated at a temperature lower than a softening point of the flux to be dried, and thereafter is activated at a temperature higher than the softening point of the flux and lower than a melting point of the solder bump, following which reflow is performed.

(12)

The method of manufacturing the mounting substrate according to (11), wherein the flux has viscosity that does not cause each of the elements to deviate from the solder bump until completion of the reflow and has volatility at which a liquid level of the flux decreases within a range in which a self-alignment effect is obtained during the reflow.

(13)

The method of manufacturing the mounting substrate according to (12), wherein, in the third step, in a reflow period, the liquid level of the flux is located at a position higher than a bonding surface between the solder bumps and the elements.

(14)

A mounting substrate, including:

a wiring substrate;

a plurality of elements each disposed at a position facing a top surface of the wiring substrate; and a plurality of solder bumps, one or more of the solder bumps being provided between the wiring substrate and each of the elements to electrically couple the wiring substrate and each of the elements to each other, each of the elements including:
a semiconductor layer,
one or more electrodes provided in contact with a portion of a bottom surface of the semiconductor layer, and
an insulating layer provided in contact with an entire portion not in contact with the one or more electrodes of the bottom surface of the semiconductor layer without contacting a side surface of the semiconductor layer.

This application is based upon and claims the benefit of priority of the Japanese Patent Application No. 2014-190952 filed in the Japan Patent Office on Sep. 19, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A method of manufacturing a mounting substrate, comprising:

a first step of forming a plurality of electrodes on a supporting substrate, forming a seed layer on an surface including the respective electrodes, and forming a through groove in a portion of the seed layer, the portion facing a portion between adjacent two of the electrodes;

a second step of forming, at a position facing each of the electrodes, one of a plurality of solder bumps electrically coupled to the seed layer; and a third step of separating the seed layer into a plurality of seed sections with use of the through groove, and thereafter mounting each of a plurality of the elements on the supporting substrate with one or more of the solder bumps in between, wherein, in the third step, the elements are mounted on the supporting substrate with the solder bumps in between in a state in which a flux is applied onto an entire surface including the respective solder bumps, and then the flux is heated at a temperature lower than a softening point of the flux to be dried, and thereafter is activated at a temperature higher than the softening point of the flux and lower than a melting point of the solder bump, following which reflow is performed.

2. The method of manufacturing the mounting substrate according to claim 1, wherein, in the first step, the respective solder bumps are formed with use of an electrolytic plating method to cause top surfaces of the respective solder bumps to become flat surfaces.

3. The method of manufacturing the mounting substrate according to claim 2, wherein, in the second step, the solder bumps are formed with use of the electrolytic plating method.

4. The method of manufacturing the mounting substrate according to claim 1, wherein the flux has viscosity that does not cause each of the elements to deviate from the solder bump until completion of the reflow and has volatility at which a liquid level of the flux decreases within a range in which a self-alignment effect is obtained during the reflow.

5. The method of manufacturing the mounting substrate according to claim 4, wherein, in the third step, in a reflow period, the liquid level of the flux is located at a position higher than a bonding surface between the solder bumps and the elements.

* * * * *